(12) United States Patent
Aoki et al.

(10) Patent No.: US 9,755,040 B2
(45) Date of Patent: Sep. 5, 2017

(54) SEMICONDUCTOR WAFER, METHOD OF PRODUCING SEMICONDUCTOR WAFER AND ELECTRONIC DEVICE

(71) Applicant: SUMITOMO CHEMICAL COMPANY, LIMITED, Tokyo (JP)

(72) Inventors: Takeshi Aoki, Ehime (JP); Noboru Fukuhara, Ibaraki (JP); Hiroyuki Sazawa, Ibaraki (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 14/953,567

(22) Filed: Nov. 30, 2015

(65) Prior Publication Data

US 2016/0079386 A1    Mar. 17, 2016

Related U.S. Application Data

(63) Continuation-in-part of application No. PCT/JP2014/002884, filed on May 30, 2014.

(30) Foreign Application Priority Data

May 31, 2013  (JP) ................................. 2013-114982

(51) Int. Cl.
*H01L 29/66* (2006.01)
*H01L 29/51* (2006.01)
(Continued)

(52) U.S. Cl.
CPC ........ *H01L 29/512* (2013.01); *H01L 21/0228* (2013.01); *H01L 21/02178* (2013.01);
(Continued)

(58) Field of Classification Search
CPC ..................................................... H01L 29/778
(Continued)

(56) References Cited

U.S. PATENT DOCUMENTS

| 6,770,923 B2 | 8/2004 | Nguyen et al. |
| 2002/0081778 A1 | 6/2002 | Inoue et al. |

(Continued)

FOREIGN PATENT DOCUMENTS

| JP | 2002170209 A | 6/2002 |
| JP | 2005183597 A | 7/2005 |

(Continued)

OTHER PUBLICATIONS

Zhou et al., "30nm Enhancement-mode In0.53Ga0.47As MOSFETs on Si Substrates Grown by MOCVD Exhibiting High Transconductance and Low On-resistance", Technical Digest of 2012 IEEE International Electron Device Meeting, pp. 32.5.1 to 32.5.4 (4 pgs. total).

(Continued)

*Primary Examiner* — David Vu
*Assistant Examiner* — Brandon Fox
(74) *Attorney, Agent, or Firm* — Sughrue Mion, PLLC

(57) ABSTRACT

To provide a semiconductor wafer having a wafer, a compound semiconductor layer, a first insulating layer and a second insulating layer, wherein in the depth direction, oxygen atoms and nitrogen atoms are continuously distributed, the number of the nitrogen atoms along the depth direction shows its maximum in the first insulating layer, the total number of third atoms and fourth atoms along the depth direction becomes the largest in the compound semiconductor layer, the number of the oxygen atoms at the interface between the compound semiconductor layer and the first (Continued)

insulating layer is smaller than the number of the oxygen atoms at the interface between the first insulating layer and the second insulating layer.

14 Claims, 51 Drawing Sheets

(51) Int. Cl.
| | | |
|---|---|---|
| *H01L 29/423* | (2006.01) | |
| *H01L 29/778* | (2006.01) | |
| *H01L 21/28* | (2006.01) | |
| *H01L 29/78* | (2006.01) | |
| *H01L 21/02* | (2006.01) | |

(52) U.S. Cl.
CPC .. *H01L 21/02205* (2013.01); *H01L 21/28264* (2013.01); *H01L 29/4236* (2013.01); *H01L 29/513* (2013.01); *H01L 29/517* (2013.01); *H01L 29/66621* (2013.01); *H01L 29/7785* (2013.01); *H01L 29/78* (2013.01)

(58) Field of Classification Search
USPC .................................................. 257/76, 194
See application file for complete search history.

(56) References Cited

U.S. PATENT DOCUMENTS

| | | | |
|---|---|---|---|
| 2005/0205015 A1* | 9/2005 | Sasaki | C23C 16/45565 |
| | | | 118/723 MA |
| 2005/0258491 A1 | 11/2005 | Bojarczuk, Jr. et al. | |
| 2006/0011915 A1 | 1/2006 | Saito et al. | |
| 2011/0068371 A1 | 3/2011 | Oka | |
| 2013/0075789 A1* | 3/2013 | Kanamura | H01L 29/42364 |
| | | | 257/194 |
| 2013/0313609 A1* | 11/2013 | Akutsu | H01L 29/78 |
| | | | 257/192 |
| 2014/0077266 A1* | 3/2014 | Ramdani | H01L 29/513 |
| | | | 257/194 |
| 2014/0091433 A1 | 4/2014 | Hata et al. | |

FOREIGN PATENT DOCUMENTS

| | | |
|---|---|---|
| JP | 2005328059 A | 11/2005 |
| JP | 2005534163 A | 11/2005 |
| JP | 200632552 A | 2/2006 |
| JP | 2008277640 A | 11/2008 |
| JP | 201171206 A | 4/2011 |
| JP | 20134545 A | 1/2013 |

OTHER PUBLICATIONS

Kordos et al., "Aluminum oxide as passivation and gate insulator in GaAs-based field-effect transistors prepared in situ by metal-organic vapor deposition", Applied Physics Letters 100, 2012, pp. 142113-1 to 142113-3 (4 pgs. total).
Chin et al., "Silane-Ammonia Surface Passivation for Gallium Arsenide Surface-Channel n-MOSFETs", IEEE Electron Device Letters, 2009, 3 pgs total.
Arabasz et al., "XPS study of surface chemistry of epiready GaAs(100) surface after (NH4)2Sx passivation", Vacuum, Elsevier, 2006, vol. 80, pp. 888 to 893.
El Kazzi et al., "Sub-nm equivalent oxide thickness on Si-passivated GaAs capacitors with low Dit", Applied Physics Letters 99, 2011, pp. 052102-1 to 052102-3 (4 pgs. total).
International Search Report dated Aug. 5, 2014, issued by the International Bureau in corresponding International Application No. PCT/JP2014/002884.
Communication dated Apr. 5, 2017, from the Intellectual Property Office of Taiwan in counterpart Taiwanese Application No. 103118954.

* cited by examiner

| Layer | detail | Composition | Thickness (nm) | doping (cm⁻³) |
|---|---|---|---|---|
| n-GaAs | contact | - | 100.0 | Si: Nd(5E18) |
| n-InGaP | etch stop | 0.48 | 10.0 | Si: Nd(3E18) |
| i-AlGaAs | | 0.24 | 10.0 | - |
| n-AlGaAs | front doping | 0.24 | 10.0 | Si: Nd(3E18) |
| i-AlGaAs | | 0.24 | 5.0 | - |
| i-InGaAs | channeal | 0.35 | 6.5 | - |
| i-AlGaAs | | 0.24 | 4.0 | - |
| n-AlGaAs | back doping | 0.24 | 5.0 | Si: Nd(2E18) |
| i-AlGaAs | | 0.24 | 10.0 | - |
| buffer layers | | | | |
| semi insulating GaAs Sub. | | | | |

FIG. 35

SEMICONDUCTOR WAFER, METHOD OF PRODUCING SEMICONDUCTOR WAFER AND ELECTRONIC DEVICE

The contents of the following Japanese patent application(s) are incorporated herein by reference:
No. 2013-114982 filed in Japan on May 31, 2013, and
No. PCT/JP2014/002884 filed on May 30, 2014.

BACKGROUND

1. Technical Field

The present invention relates to a semiconductor wafer, a method of producing a semiconductor wafer and an electronic device.

2. Related Art

Silicon is usually used as an N-type channel material of a MIS-type gate FET (MISFET: Metal-Insulator-Semiconductor Field-Effect Transistor), which is a basic device of a large-scale integrated circuit. On the other hand, a Group III-V compound semiconductor enables high-speed operation thanks to the high electron mobility it provides, and is regarded as a prospect for application as an alternative material to silicon in an N-type MISFET. In a high electron mobility transistor (HEMT) or a pseudomorphic high electron mobility transistor (P-HEMT) that has a Schottky-gate structure or a pn junction gate structure, a Group III-V compound semiconductor has already been used as its channel material, and often utilized for a high-frequency communication device. For a purpose of obtaining a further favorable transistor performance such as a higher gate breakdown voltage, research for a transistor that has a MIS gate structure (hereinafter, sometimes referred to as "MIS structure") has been conducted, and Non-patent Literature 1 discloses a MIS-HEMT that has a MIS gate structure and Non-patent Literature 2 discloses a MIS-P-HEMT that has a MIS gate structure.

In order to favorably operate an electronic device that has a MIS structure, control of the interface between a Group III-V compound semiconductor and an insulator, that is, reduction of energy levels (hereinafter, referred to as "interface states") formed at and near the interface between the Group III-V compound semiconductor and the insulator. The interface state may cause lowering of the electric field controllability of a free carrier in a channel, and lowering of the operation speed due to charging and discharging of carriers between the interface states and conduction or valence bands. Also, it may become a factor of carrier disappearance due to interface recombination. Furthermore, interface states may become a factor of degradation of the transistor performance such as lowering of carrier mobility.

As effective interface state reduction methods, Non-patent Literature 3 describes about processing of a surface of a compound semiconductor by using sulfide, Non-patent Literature 4 describes about processing of a surface of a compound semiconductor by using silane and ammonia, and Non-patent Literature 5 describes about use of amorphous silicon as an interface layer. Also, Patent Literature 1 describes about an invention of a MIS-type electric field effect transistor of a compound semiconductor. The invention has been made for a purpose of providing a MIS-type electric field effect transistor with low gate leak current and less interface states occurring at an insulating film/a compound semiconductor that operates at high voltage and shows high output characteristics, and is characterized in that the gate insulating film is a an oxide of aluminum containing nitrogen. It is stated that by using an oxide of aluminum containing nitrogen for the gate insulating film, leakage paths within the film are eliminated, and by obtaining a sufficient barrier height with respect to a nitride semiconductor, it is possible to lower the gate leak current, and control interface states occurring at the semiconductor interface which becomes a main factor of temporal fluctuation in the drain current.

PRIOR ART TECHNICAL LITERATURES

Non-Patent Literatures

[Non-patent Literature 1] Xiuju Zhou, Qiang Li, Chak Wah Tang and Kei May Lau, 30 nm Enhancement-mode In0.53Ga0.47As MOSFETs on Si Wafers Grown by MOCVD Exhibiting High Transconductance and Low On-resistance, Technical Digest of 2012 IEEE International Electron Device Meeting.

[Non-patent Literature 2] P. Kordos, et al., Aluminum oxide as passivation and gate insulator in GaAs-based field-effect transistors prepared in situ by metal-organic vapor deposition, APPLIED PHYSICS LETTERS 100, 142113 (2012)

[Non-patent Literature 3] S. Arabasz, et al., Vac. Volume 80 (2006), Page 888

[Non-patent Literature 4] Chin, H. C. et al. Silane-ammonia surface passivation for gallium arsenide surface-channel n-MOSFETs. IEEE Electron Device Lett. 30, 110-112 (2009).

[Non-patent Literature 5] M. El Kazzi, et al., Sub-nm equivalent oxide thickness on Si-passivated GaAs capacitors with low Dit, APPLIED PHYSICS LETTERS 99, 052102 (2011)

Patent Literatures

[Patent Literature 1] Japanese Patent Application Publication No. 2005-183597

In an electronic device that has a MIS or MOS (Metal-Oxide-Semiconductor) structure (hereinafter, a MIS structure and a MOS structure are collectively referred to as "MIS structure" simply) formed by using a compound semiconductor, if the density of interface states that exist at the interface between a semiconductor and an insulator is high, various types of problems occur depending on the energy of the interface states (position from the lower end of the conduction band or the upper end of the valence band in the band model). For example, an interface state that is located in the middle of the band gap (mid-gap) may cause Fermi-level pinning in which the Fermi-level of the semiconductor does not change even when the metal potential of the MIS structure is changed. An interface state near a band edge may increase the frequency dispersion of the accumulation capacitance in room temperature CV (capacitance-voltage) measurement of a p-type or n-type semiconductor. Both the Fermi-level pinning and increase in the frequency dispersion degrade electronic device performance, e.g., the Id-Vg (drain current-gate voltage) characteristics and S value (sub-threshold swing factor) of a MISFET. To reduce interface states is an important technical issue for improvement in the performance of an electronic device that has a compound semiconductor MIS structure.

An object of the present invention is to provide a technique that enables reduction of interface states in a compound semiconductor MIS structure, e.g., interface states in the mid-gap region. Also, another object is to provide a technique that enables reduction of interface states, and reduction of the frequency dispersion of the accumulation capacitance when room temperature CV measurement of a device that has a compound semiconductor MIS structure is performed. Also, a still another object is to provide a technique that makes it possible to make favorable the performance like the Id-Vg characteristics, etc. of a transistor that has a compound semiconductor MIS structure.

SUMMARY

In order to achieve the above-mentioned objects, a first aspect of the present invention provides a semiconductor wafer having a wafer, a compound semiconductor layer, a first insulating layer and a second insulating layer that are positioned in the order of the wafer, the compound semiconductor layer, the first insulating layer and the second insulating layer, wherein the first insulating layer contains: one or more first atoms that are selected from the group consisting of all the metallic atoms, B atoms, Si atoms, As atoms, Te atoms and At atoms; oxygen atoms; and nitrogen atoms, the second insulating layer contains: one or more second atoms selected from the group consisting of all the metallic atoms; oxygen atoms; and nitrogen atoms, the compound semiconductor layer contains: third atoms that are metallic atoms; and fourth atoms that are non-metallic atoms, in the depth direction that is from a surface of the second insulating layer to the wafer, the oxygen atoms and the nitrogen atoms are continuously distributed in the second insulating layer, the first insulating layer and the compound semiconductor layer, the number of atoms per unit volume of the nitrogen atoms along the depth direction shows its maximum in the first insulating layer, the total number of atoms per unit volume of the third atoms and the fourth atoms along the depth direction becomes the largest in the compound semiconductor layer, the number of atoms per unit volume of the oxygen atoms at a first interface which is the interface between the compound semiconductor layer and the first insulating layer is smaller than the number of atoms per unit volume of the oxygen atoms at a second interface which is the interface between the first insulating layer and the second insulating layer.

The first atoms and the second atoms may be insulating layer-constituting metallic atoms consisting of a homogeneous element, and in the depth direction, the insulating layer-constituting metallic atoms, the oxygen atoms and the nitrogen atoms may be distributed continuously in the second insulating layer, the first insulating layer and the compound semiconductor layer. The number of atoms per unit volume of the insulating layer-constituting metallic atoms at the first interface may be smaller than the number of atoms per unit volume of the insulating layer-constituting metallic atoms at the second interface. The number of atoms per unit volume of the third atoms at the first interface may be larger than the number of atoms per unit volume of the third atoms at the second interface, and the number of atoms per unit volume of the fourth atoms at the first interface may be larger than the number of atoms per unit volume of the fourth atoms at the second interface. The number of atoms per unit volume of the nitrogen atoms in the second insulating layer along the depth direction may increase as the depth increases. The number of atoms per unit volume of the nitrogen atoms in the compound semiconductor layer along the depth direction may decrease as the depth increases. The third atoms and the fourth atoms may be present in the first insulating layer, and the number of atoms per unit volume of the third atoms and the fourth atoms in the first insulating layer along the depth direction may increase as the depth increases. Examples of the first atoms are one or more atoms selected from the group consisting of Al atoms, Ga atoms, In atoms, Ti atoms, Zr atoms, Hf atoms, Gd atoms, Er atoms, B atoms, Si atoms, As atoms, Te atoms and At atoms, and examples of the second atoms are one or more atoms selected from the group consisting of Al atoms, Ga atoms, In atoms, Ti atoms, Zr atoms, Hf atoms, Gd atoms and Er atoms. The first insulating layer and the second insulating layer may contain hydrogen atoms, and in this case, the largest value of the number of atoms per unit volume of hydrogen atoms in the first insulating layer is preferably larger than the largest value of the number of atoms per unit volume of hydrogen atoms in the second insulating layer. The first insulating layer may be formed by CVD (Chemical Vapor Deposition) at a wafer temperature of 250° C. or higher and 450° C. or lower, and the second insulating layer may be formed by ALD (Atomic Layer Deposition) successively without exposure to the atmosphere after forming the first insulating layer.

A second aspect of the present invention provides a method of producing a semiconductor wafer, the method comprising: forming a compound semiconductor layer on a wafer; forming a first insulating layer on the compound semiconductor layer by CVD by using a first gas and a second gas as source gases, and at a wafer temperature of 250° C. or higher and 450° C. or lower; and after forming the first insulating layer, forming a second insulating layer by ALD by using a third gas and a fourth gas, wherein the first gas is a gas containing a gaseous compound of first atoms, the second gas is one or more gases selected from the group consisting of gaseous nitrogen compounds and nitrogen molecules, the third gas is a gas containing a gaseous compound of second atoms, the fourth gas is one or more gases selected from the group consisting of gaseous oxygen compounds and oxygen molecules, the first atoms are one or more atoms selected from the group consisting of all the metallic atoms, B atoms, Si atoms, As atoms, Te atoms and At atoms, and the second atoms are one or more atoms selected from the group consisting of all the metallic atoms. After forming the first insulating layer, the second insulating layer is preferably formed successively without exposure to the atmosphere.

A third aspect of the present invention provides an electronic device comprising the semiconductor wafer according to claim 1, a source electrode, a drain electrode, and a gate electrode, wherein the compound semiconductor layer, the first insulating layer, the second insulating layer and the gate electrode are positioned in the order of the compound semiconductor layer, the first insulating layer, the second insulating layer and the gate electrode, and the source electrode and the drain electrode are positioned to sandwich the gate electrode in a planar arrangement, and is electrically connected with the compound semiconductor layer. The compound semiconductor layer may have a recess structure, and the gate electrode is preferably positioned on the recess structure.

The left graph shows the room temperature-CV characteristics of a p-type wafer, and the right graph shows the room temperature-CV characteristics of an n-type wafer.

Figure 11:
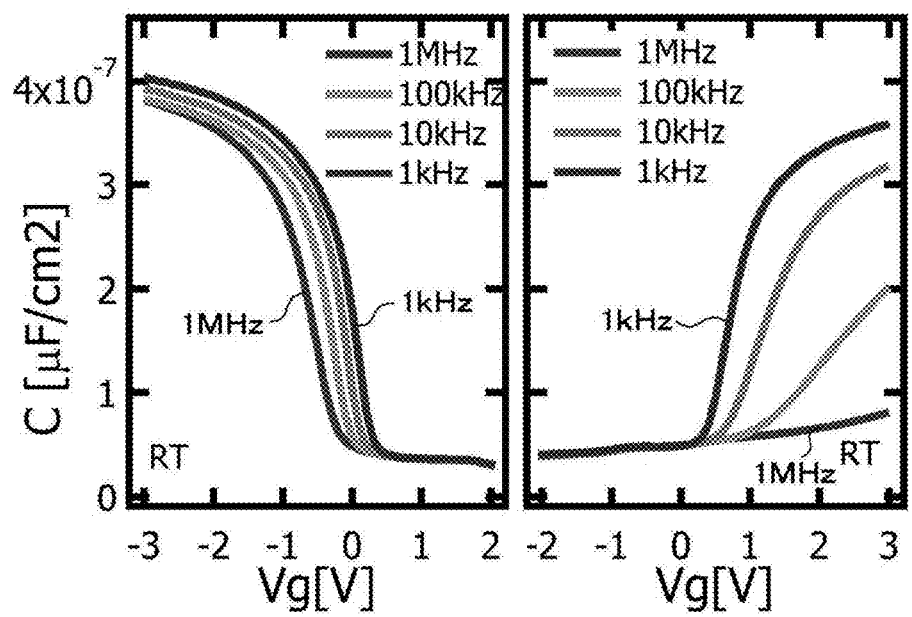

FIG. 11 shows the room temperature-CV characteristics of a MIS diode formed by using the semiconductor wafer according to the comparative example. The left graph shows the room temperature-CV characteristics of a p-type wafer, and the right graph shows the room temperature-CV characteristics of an n-type wafer.

Figure 12:
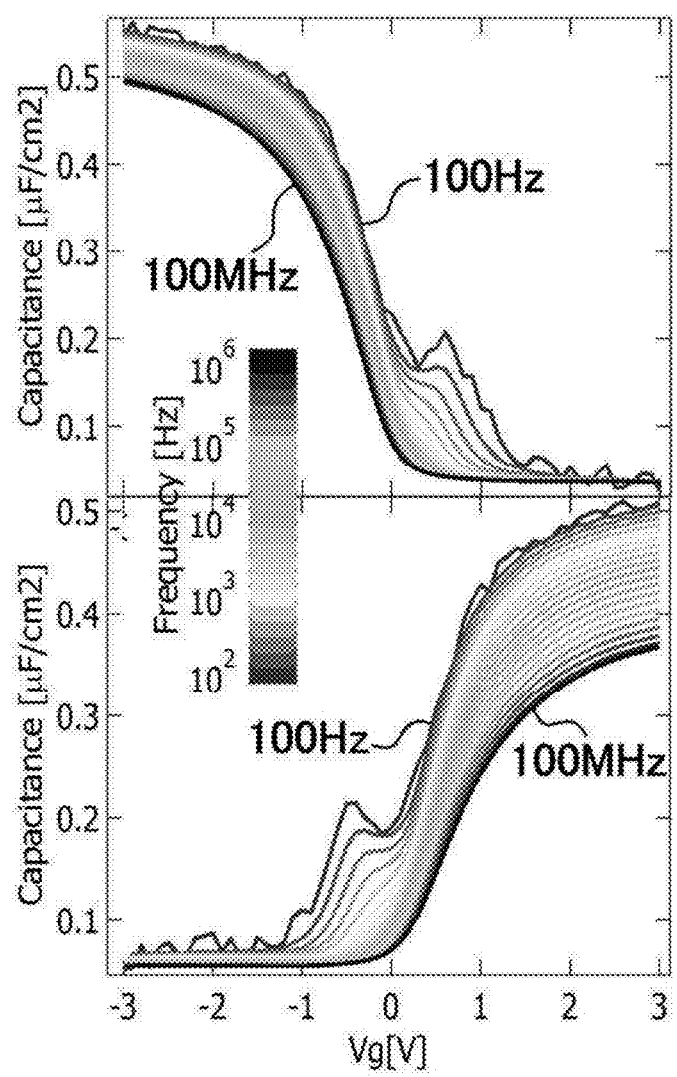

FIG. 12 shows the high temperature-CV characteristics of a MIS diode formed by using the semiconductor wafer according to the first example. The top graph shows the high temperature-CV characteristics of a p-type wafer, and the bottom graph shows the high temperature-CV characteristics of an n-type wafer.

Figure 13:
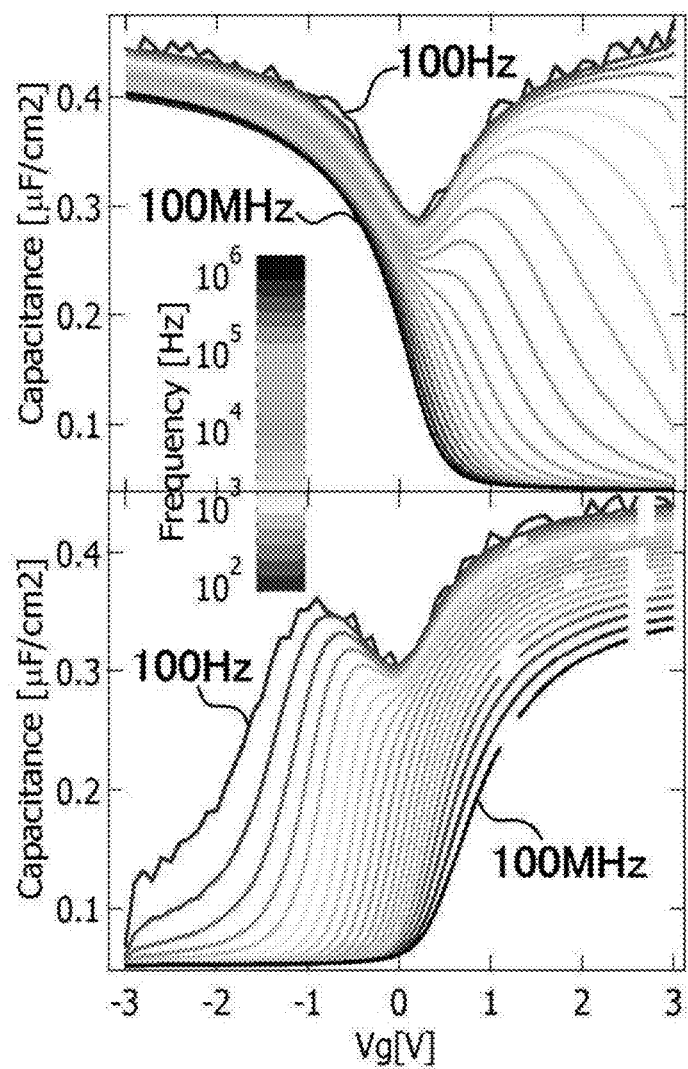

FIG. 13 shows the high temperature-CV characteristics of a MIS diode formed by using the semiconductor wafer according to the comparative example. The top graph shows the high temperature-CV characteristics of a p-type wafer, and the bottom graph shows the high temperature-CV characteristics of an n-type wafer.

Figure 14:
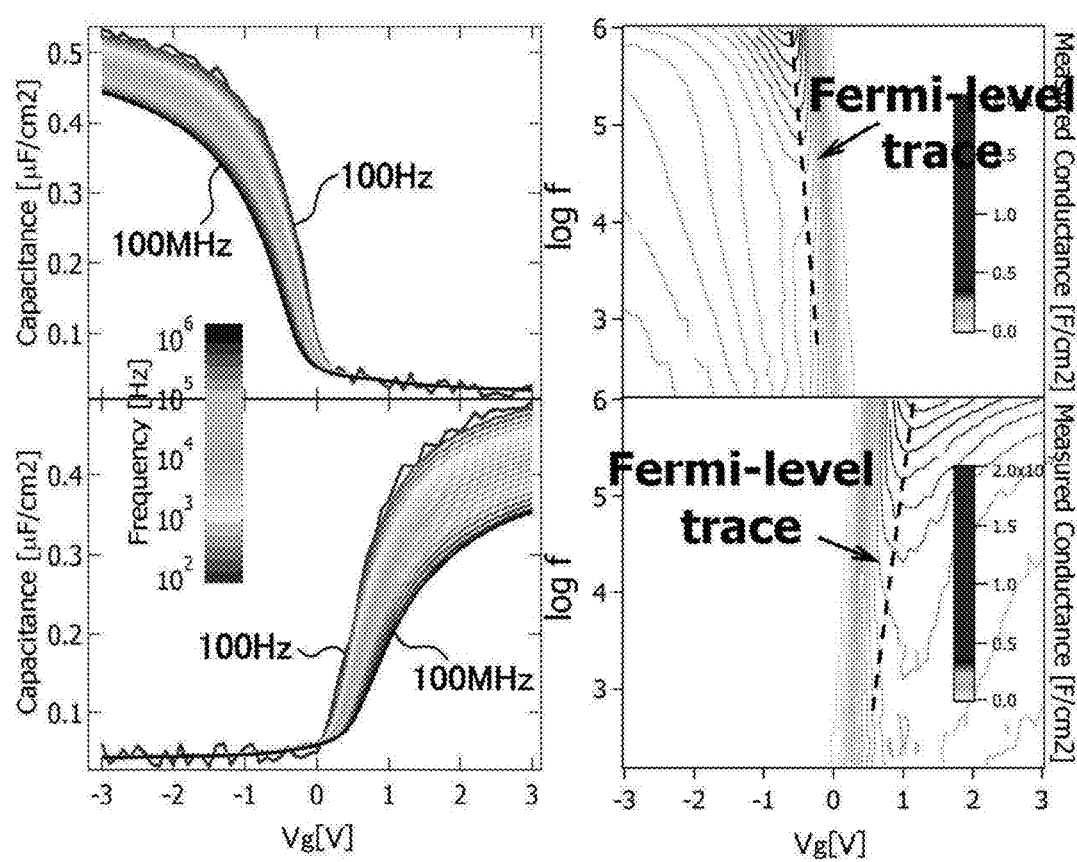

FIG. 14 shows the room temperature-CV characteristics (left graphs) and room temperature-GV spectrum analysis map (right graphs) of a MIS diode formed by using the semiconductor wafer according to the first example. The top graphs show data about a p-type wafer, and the bottom graphs show data about an n-type wafer.

Figure 15:
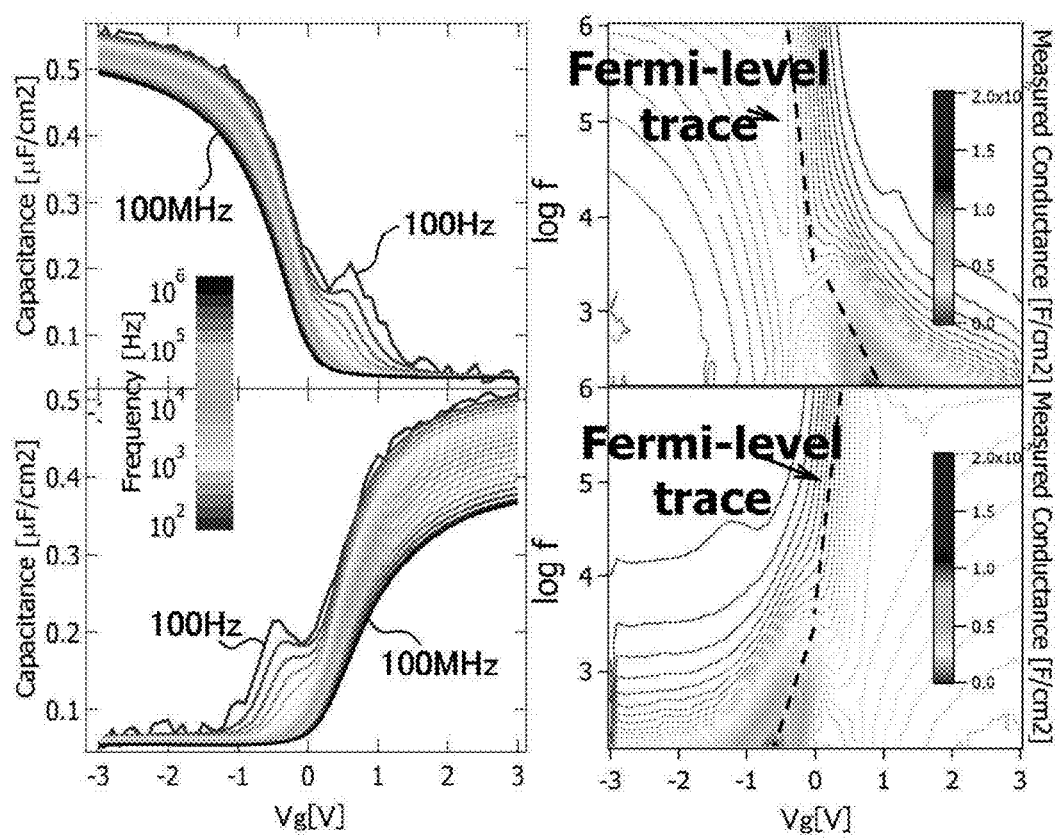

FIG. 15 shows the high temperature-CV characteristics (left graphs) and high temperature-GV spectrum analysis map (right graphs) of a MIS diode formed by using the semiconductor wafer according to the first example. The top graphs show data about a p-type wafer, and the bottom graphs show data about an n-type wafer.

Figure 16:
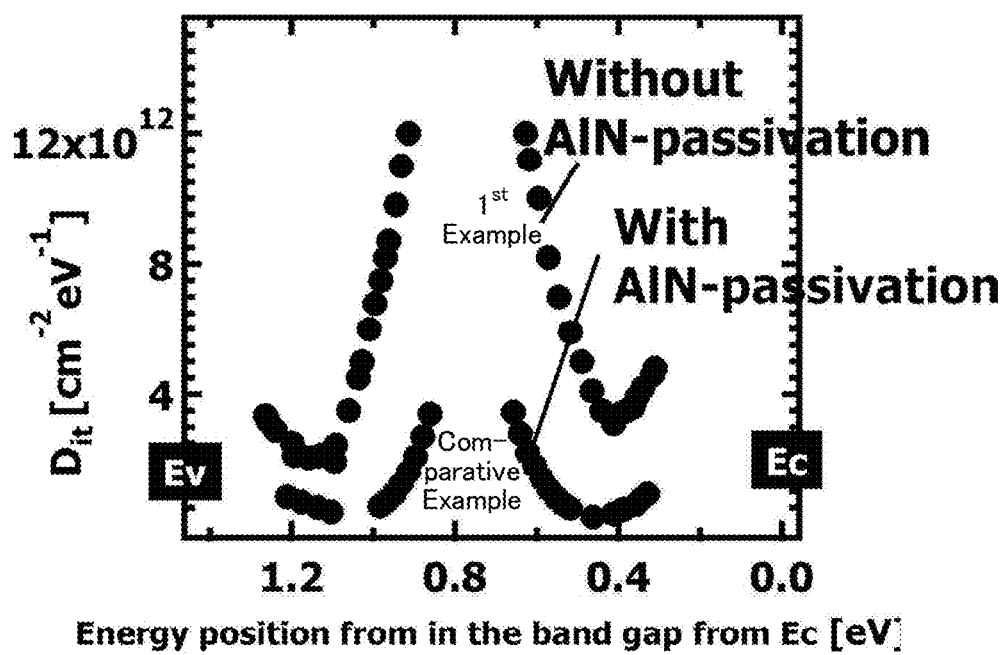

FIG. 16 is a graph that shows the interface state density (Dit) obtained by a conductance method from results of CV measurement performed on a MIS diode configured by using the semiconductor wafer according to the first example at room temperature, 60° C., 100° C. and 150° C., and the horizontal axis of the graph indicates energy from the conduction band. For comparison, the interface state density of the comparative example that was obtained in a similar manner is shown.

Figure 17:
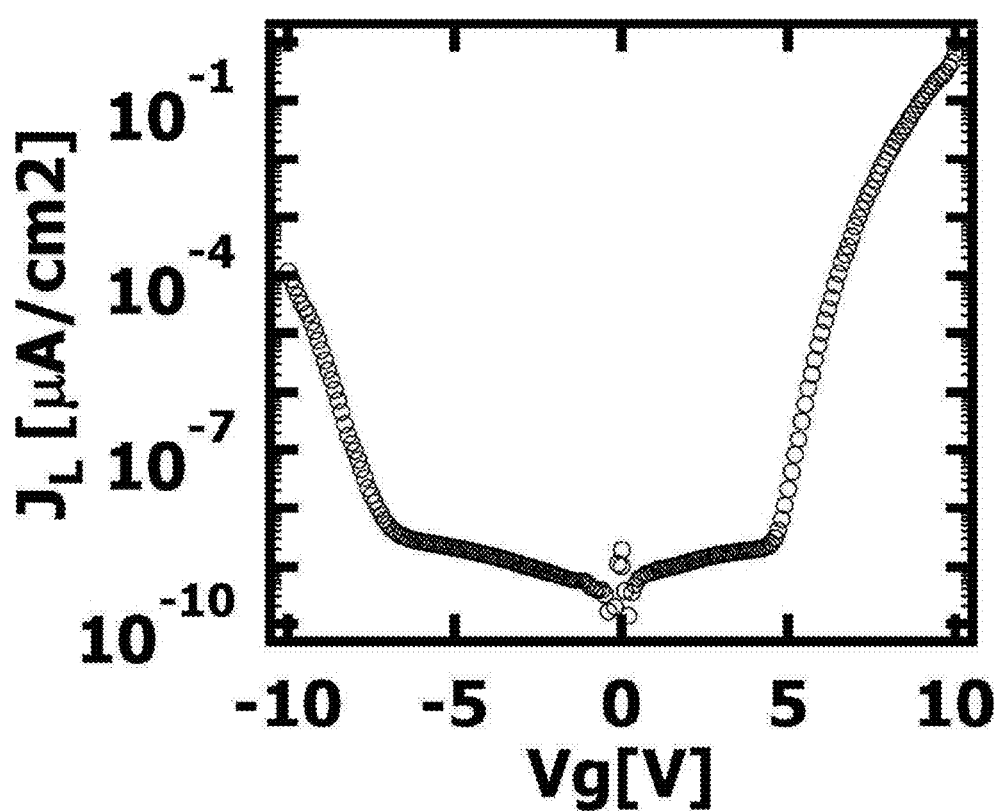

FIG. 17 shows the JV characteristics of a MIS diode formed by using the semiconductor wafer according to the first example. The plot where Vg is 0 V or lower shows data about a p-type wafer, and the plot where Vg is 0 V or higher shows data about an n-type wafer.

Figure 18:
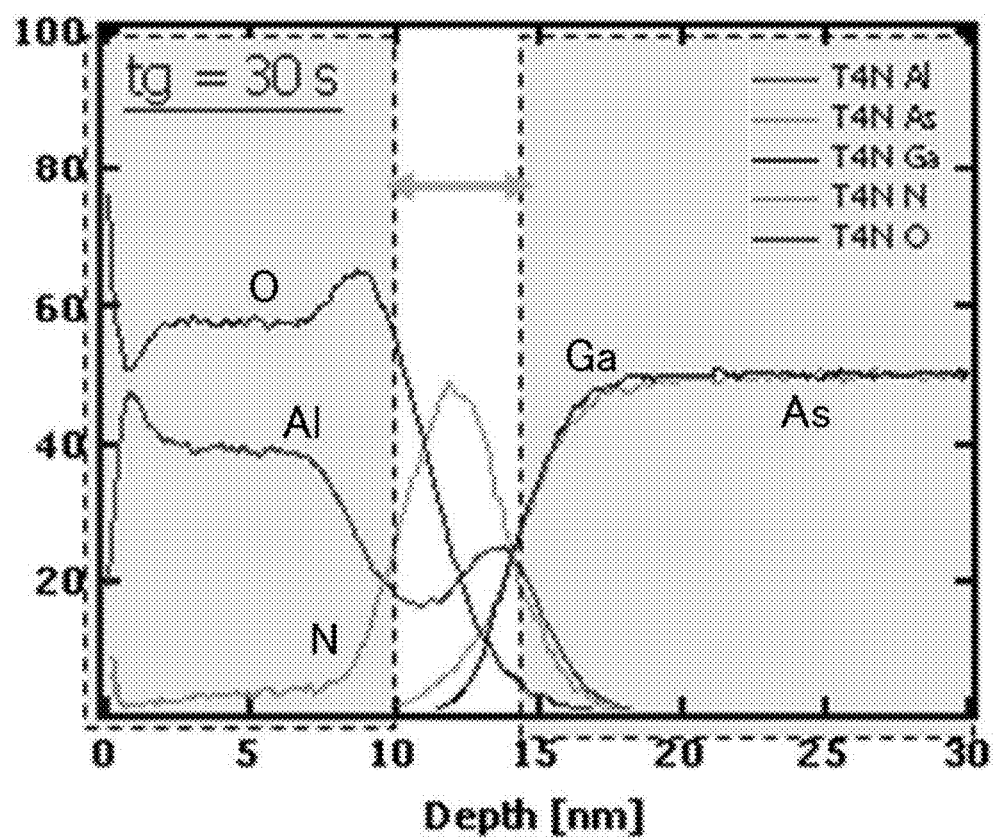

FIG. 18 shows the SIMS depth profile of a semiconductor wafer with the AlN layer-design thickness of 2 nm.

Figure 19:
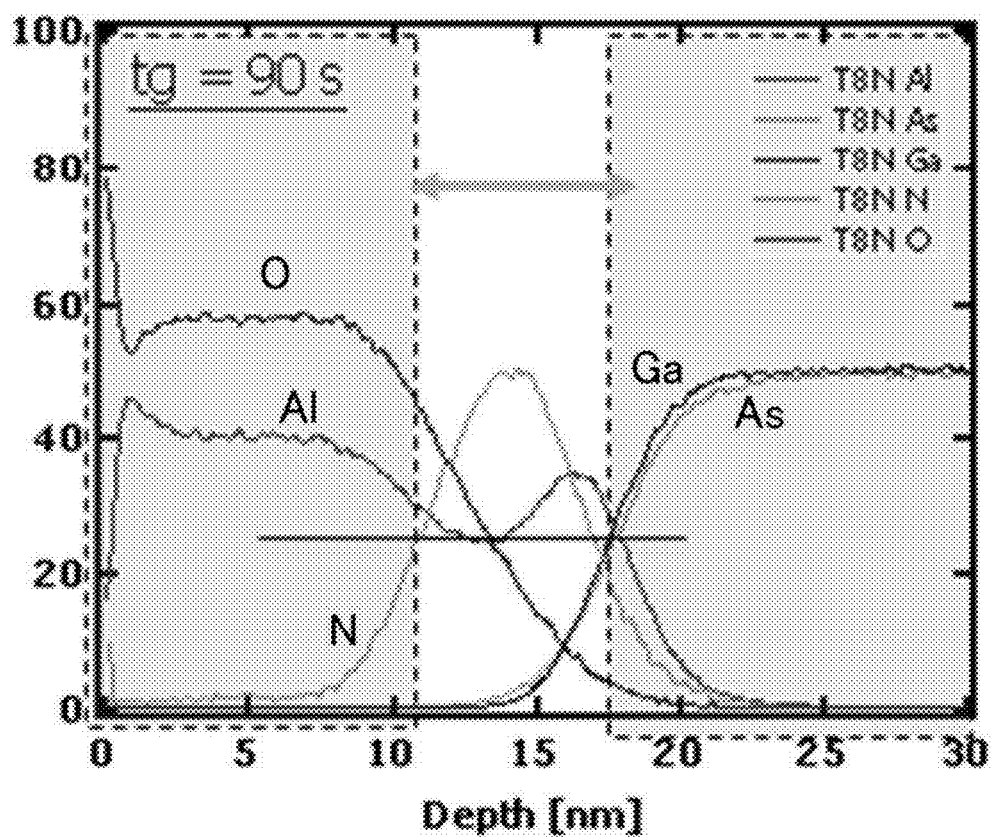

FIG. 19 shows the SIMS depth profile of a semiconductor wafer with the AlN layer-design thickness of 6 nm.

Figure 20:
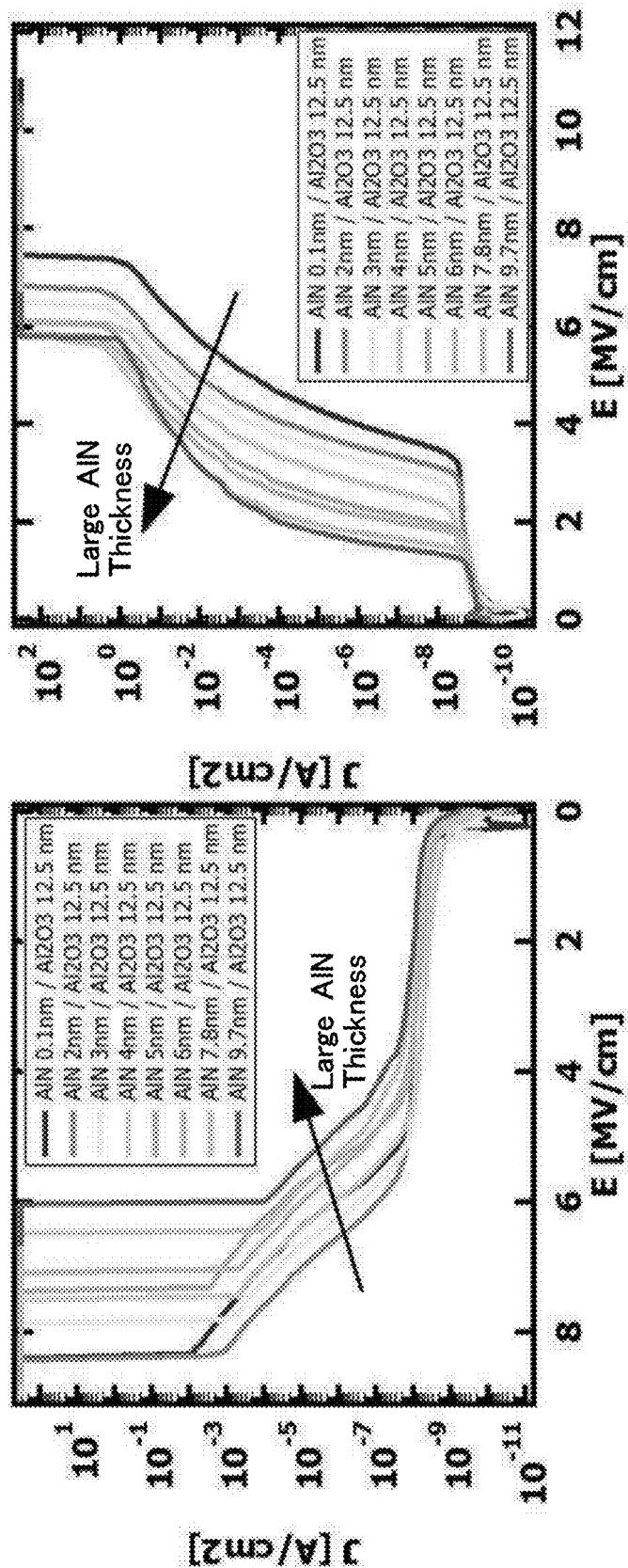

FIG. 20 shows the IV characteristics of a MIS diode when its AlN layer-design thickness was changed, the vertical axis indicates the current density, and the horizontal axis indicates the electric field intensity within the insulating layer.

Figure 21:
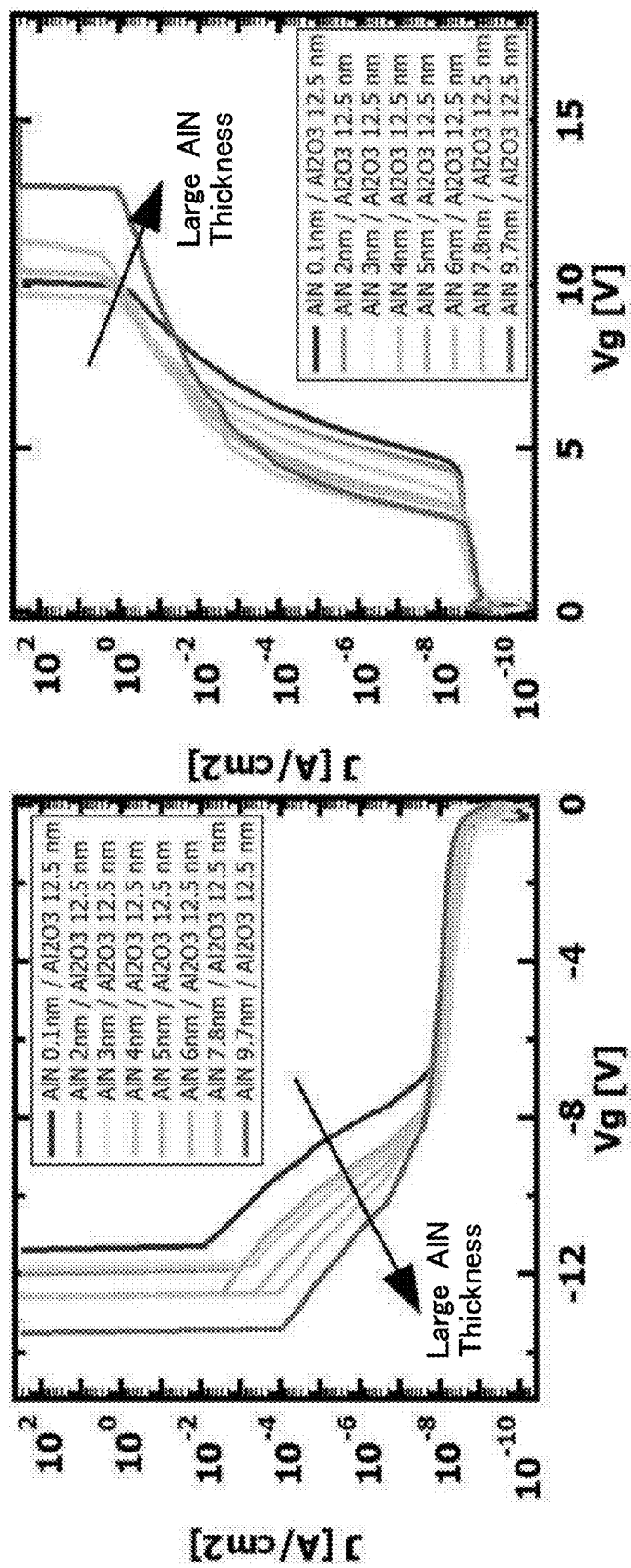

FIG. 21 shows the IV characteristics of a MIS diode when its AlN layer-design thickness was changed, the vertical axis indicates the current density, and the horizontal axis indicates the inter-electrode voltage (Vg).

Figure 22:
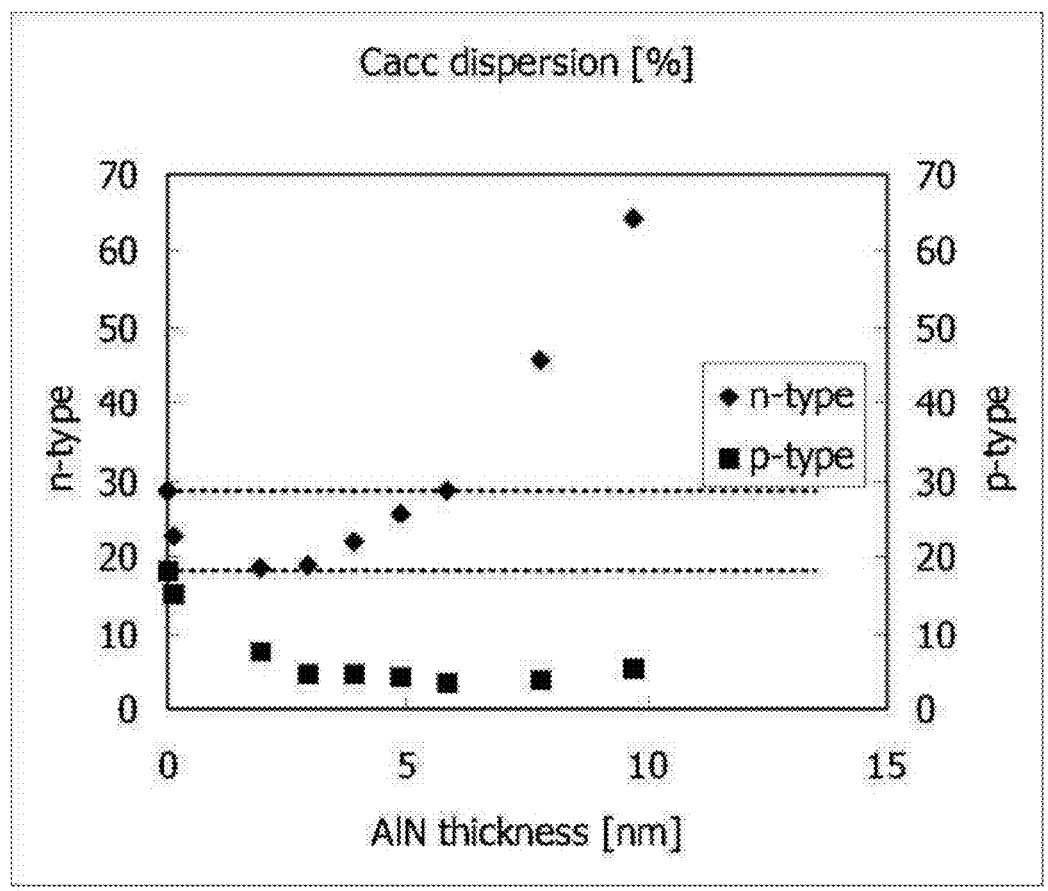

FIG. 22 shows a graph obtained by plotting, in relation to the thickness of the AlN layer, the frequency dispersion of the accumulation capacitance obtained from the room temperature-CV characteristics of the MIS diodes configured by using the semiconductor wafer whose AlN layer-design thickness was changed and the semiconductor wafer according to the comparative example.

Figure 23:
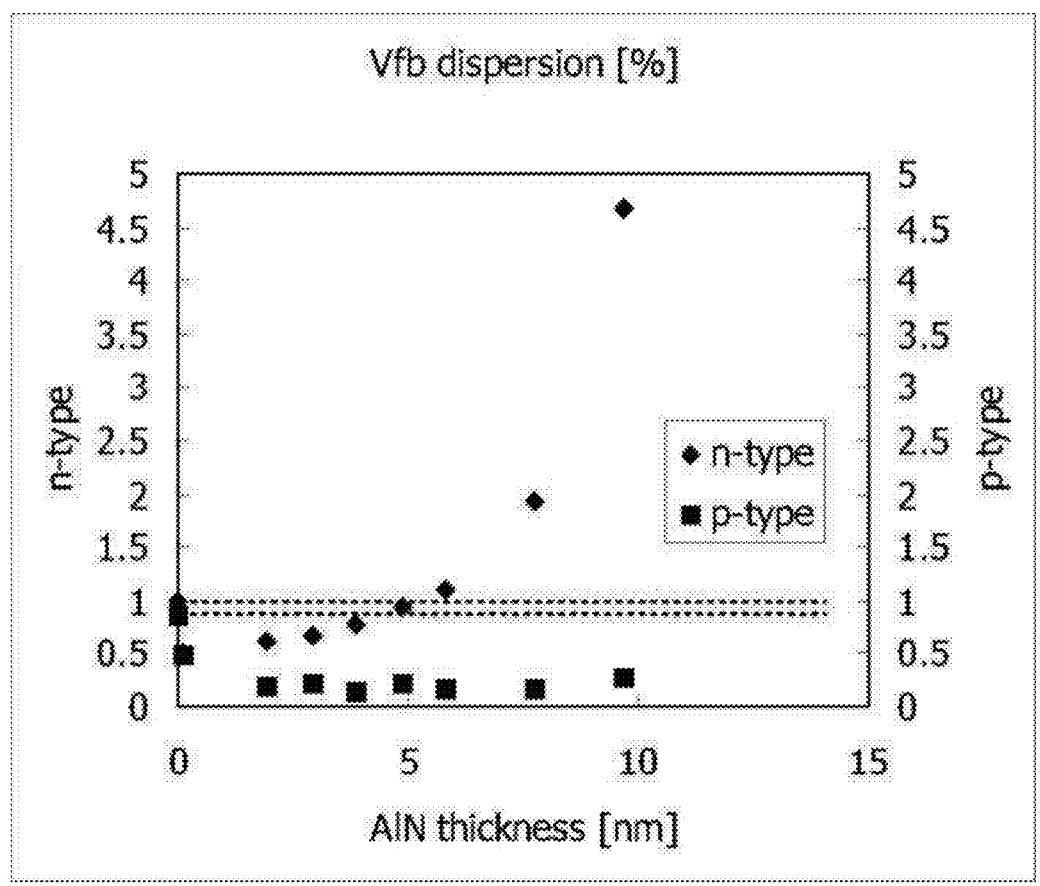

FIG. 23 shows a graph obtained by plotting, in relation to the thickness of the AlN layer, the frequency dispersion of flat band voltage obtained from the room temperature-CV characteristics of the MIS diodes configured by using the semiconductor wafer whose AlN layer-design thickness was changed and the semiconductor wafer according to the comparative example.

Figure 24:
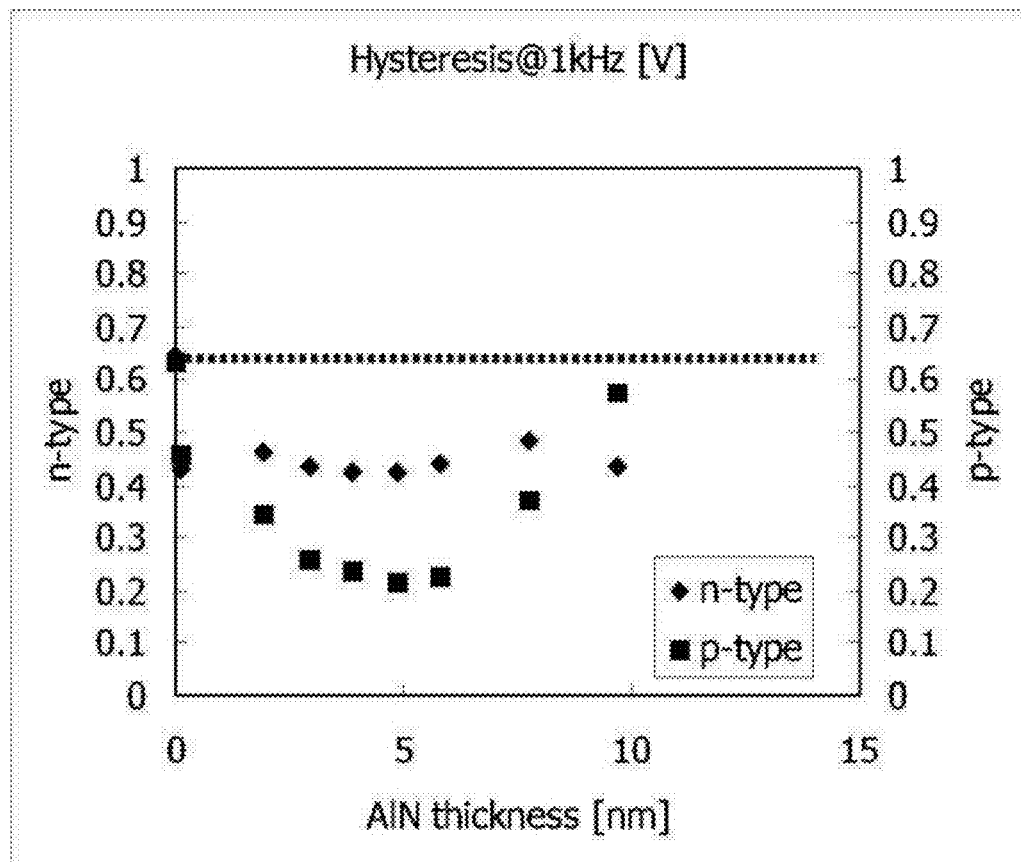

FIG. 24 shows a graph obtained by plotting, in relation to the thickness of the AlN layer, the hysteresis at 1 kHz obtained from the room temperature-CV characteristics of the MIS diodes configured by using the semiconductor wafer whose AlN layer-design thickness was changed and the semiconductor wafer according to the comparative example.

Figure 25:
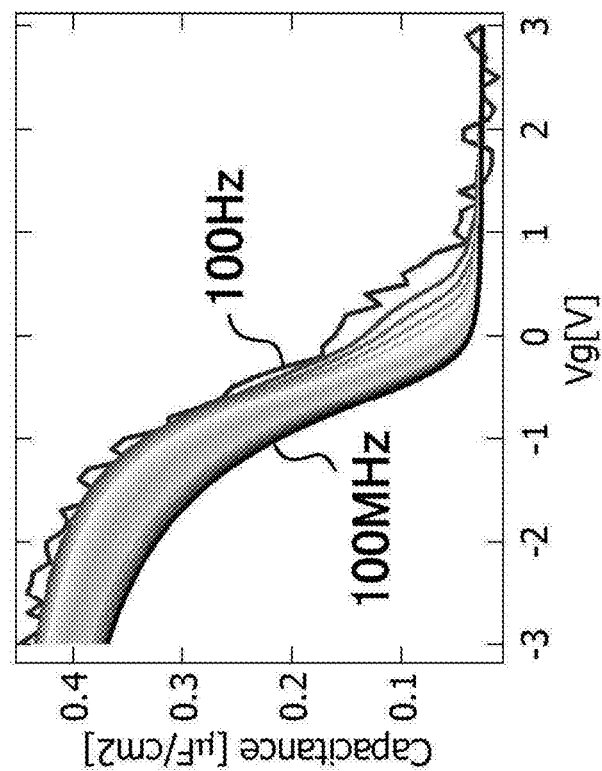
Figure 25:
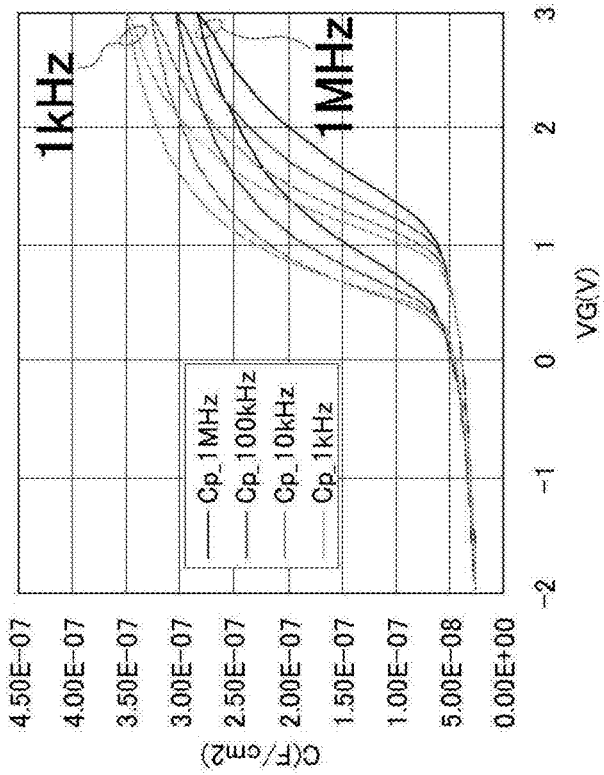

FIG. 25 shows the room temperature-CV characteristics (left) and high temperature-CV characteristics (right) of a MIS diode for which the AlN layer formation temperature was 250° C.

Figure 26:
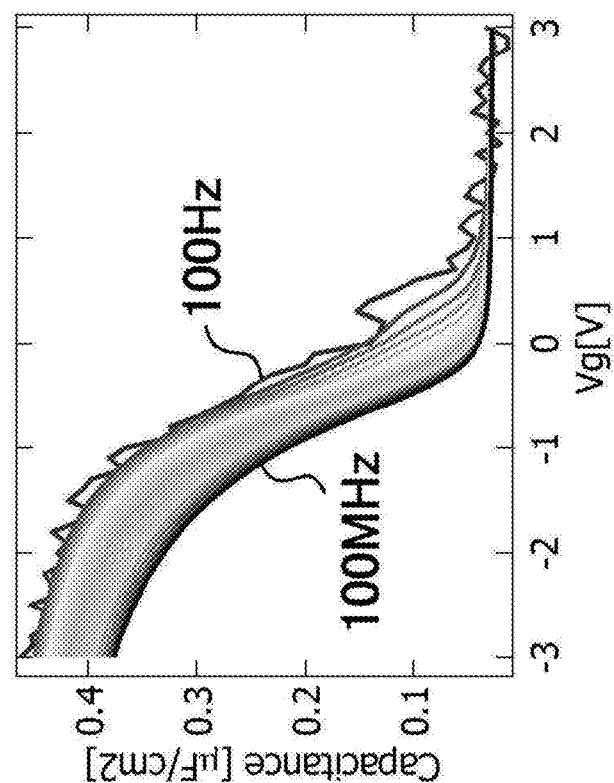
Figure 26:
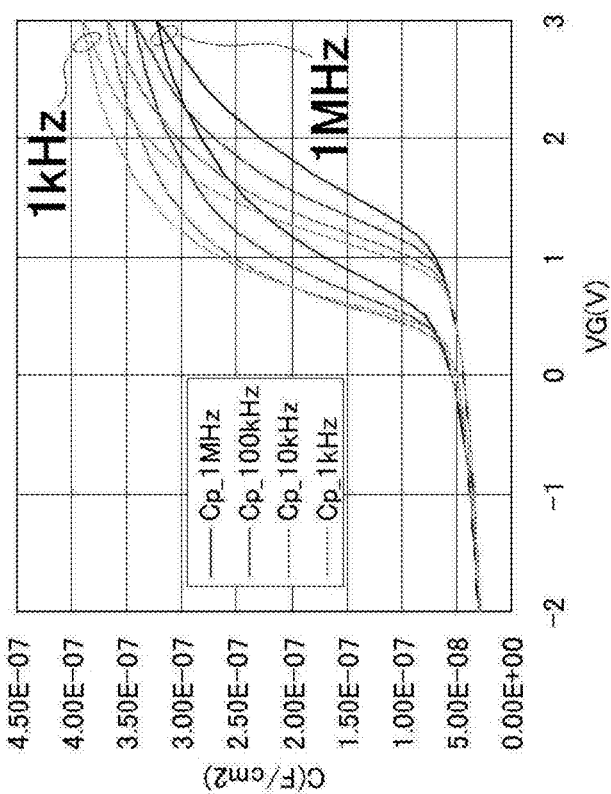

FIG. 26 shows the room temperature-CV characteristics (left) and high temperature-CV characteristics (right) of a MIS diode for which the AlN layer formation temperature was 300° C.

Figure 27:
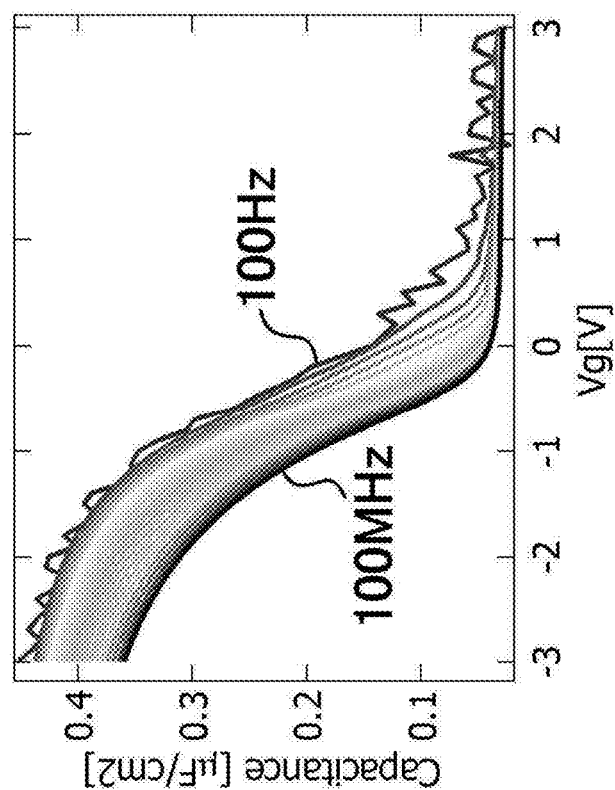
Figure 27:
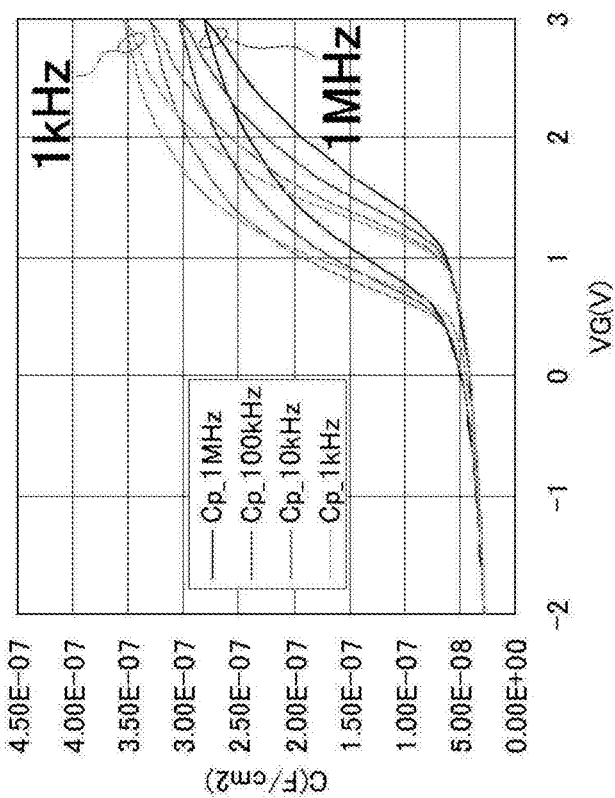

FIG. 27 shows the room temperature-CV characteristics (left) and high temperature-CV characteristics (right) of a MIS diode for which the AlN layer formation temperature was 350° C.

Figure 28:
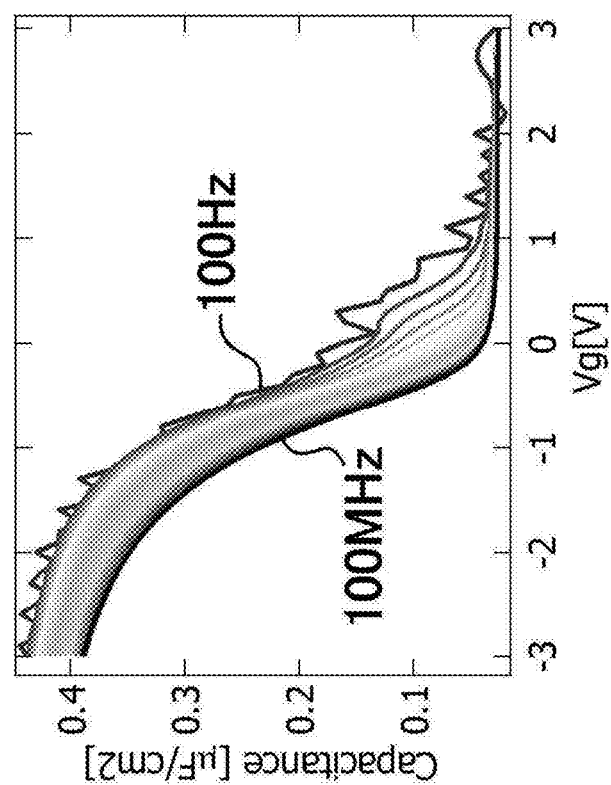
Figure 28:
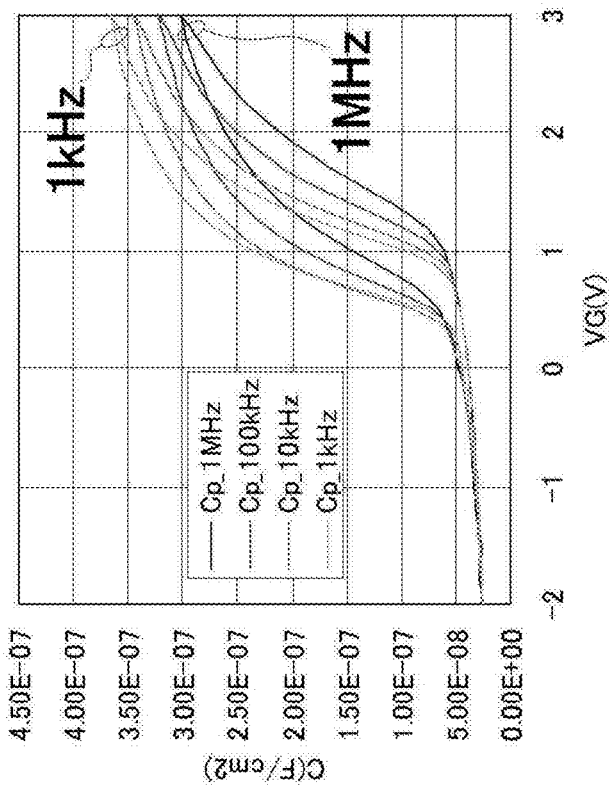

FIG. 28 shows the room temperature-CV characteristics (left) and high temperature-CV characteristics (right) of a MIS diode for which the AlN layer formation temperature was 450° C.

Figure 29:
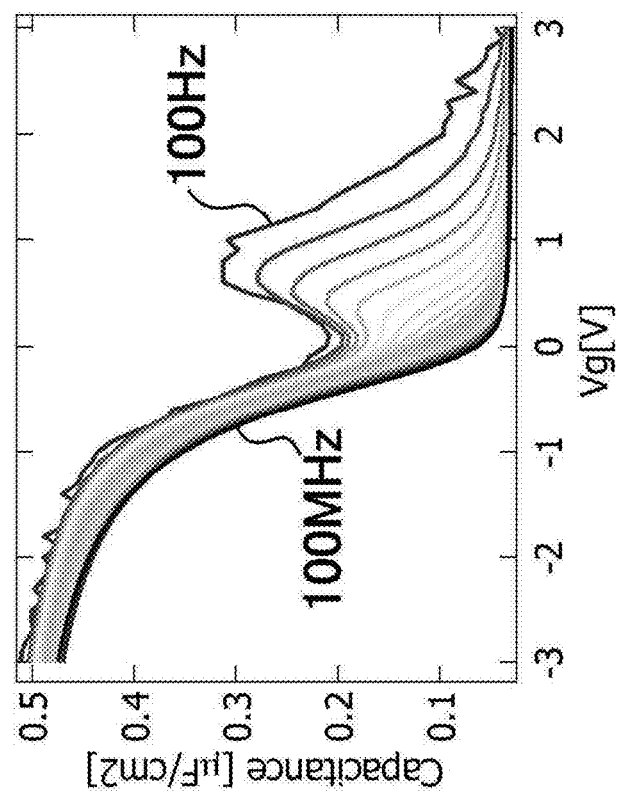
Figure 29:
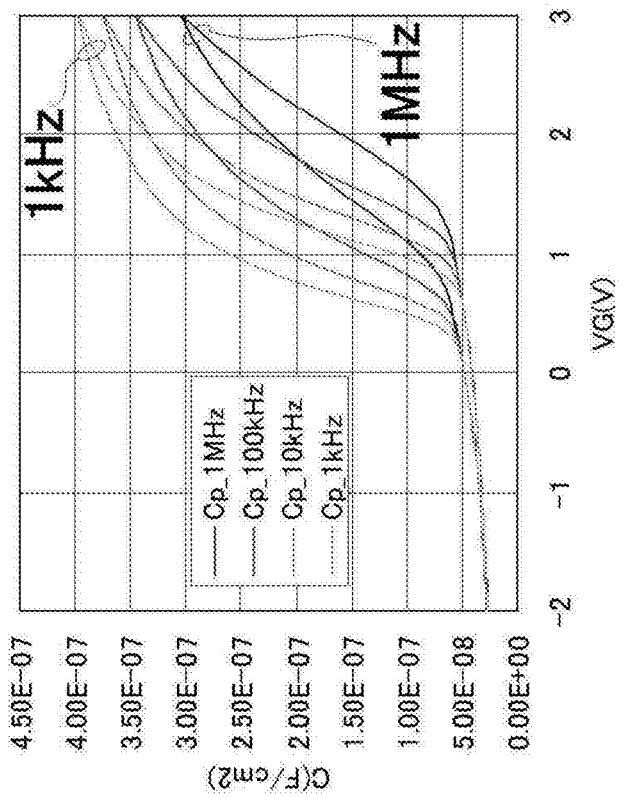

FIG. 29 shows the room temperature-CV characteristics (left) and high temperature-CV characteristics (right) of a MIS diode for which the AlN layer formation temperature was 550° C.

Figure 30:
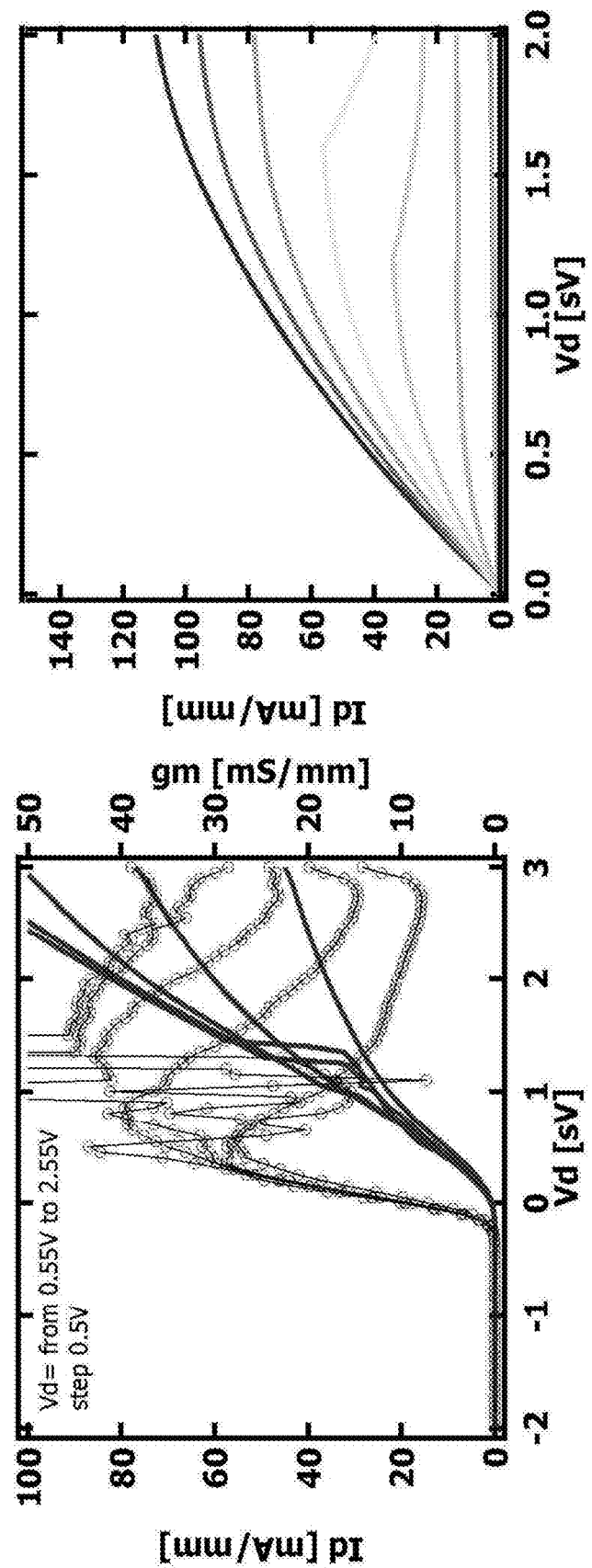

FIG. 30 shows the Id-Vd characteristics and gm-Vd characteristics of the MIS transistor according to the fourth example. The right graph shows the Id-Vd characteristics with the range of Vd shown by being enlarged.

Figure 31:
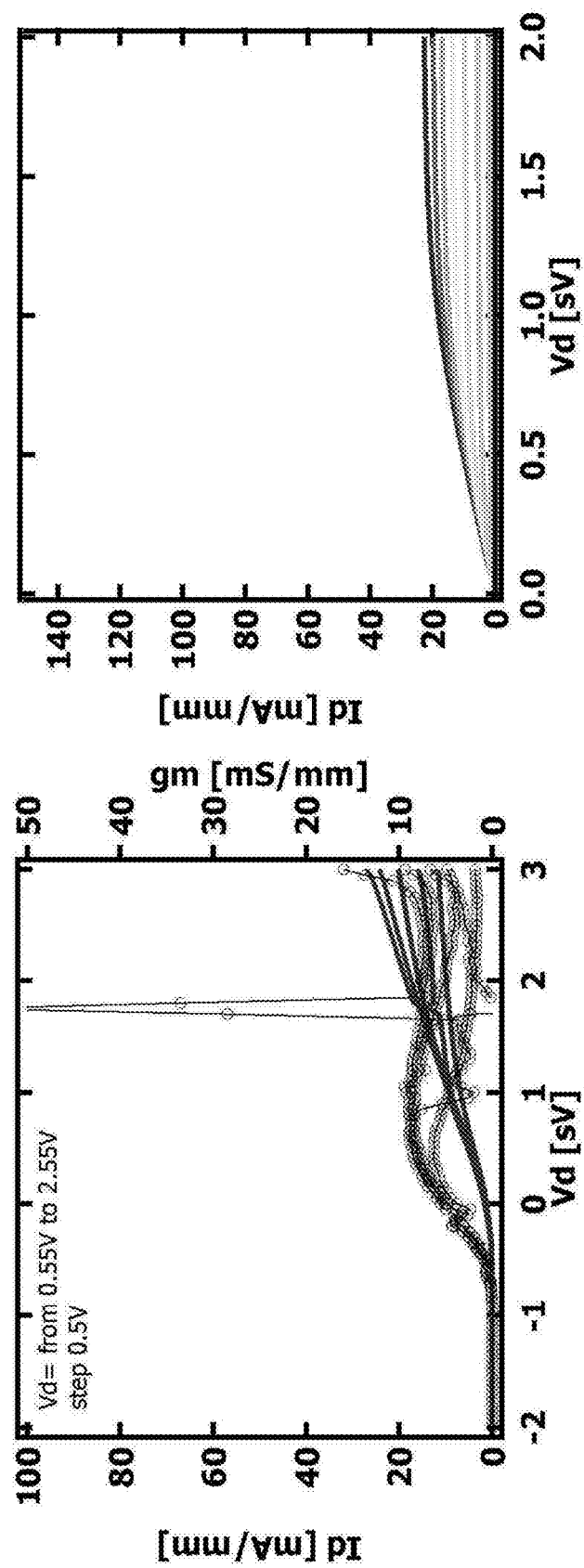

FIG. 31 shows the Id-Vd characteristics and gm-Vd characteristics of a MIS transistor according to the comparative example (no AlN layer). The right graph shows the Id-Vd characteristics with the range of Vd shown by being enlarged.

Figure 32:
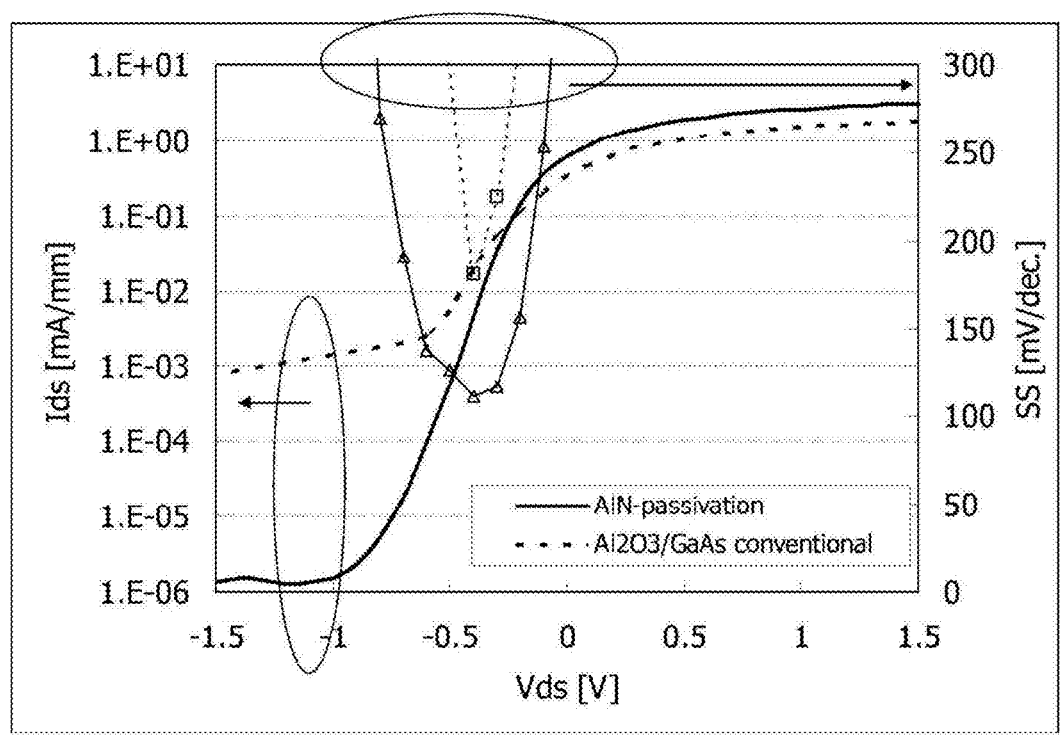

FIG. 32 shows the Id-Vg characteristics and S values of the MIS transistors according to the fourth example and the comparative example when Vd=0.05 V.

Figure 33:
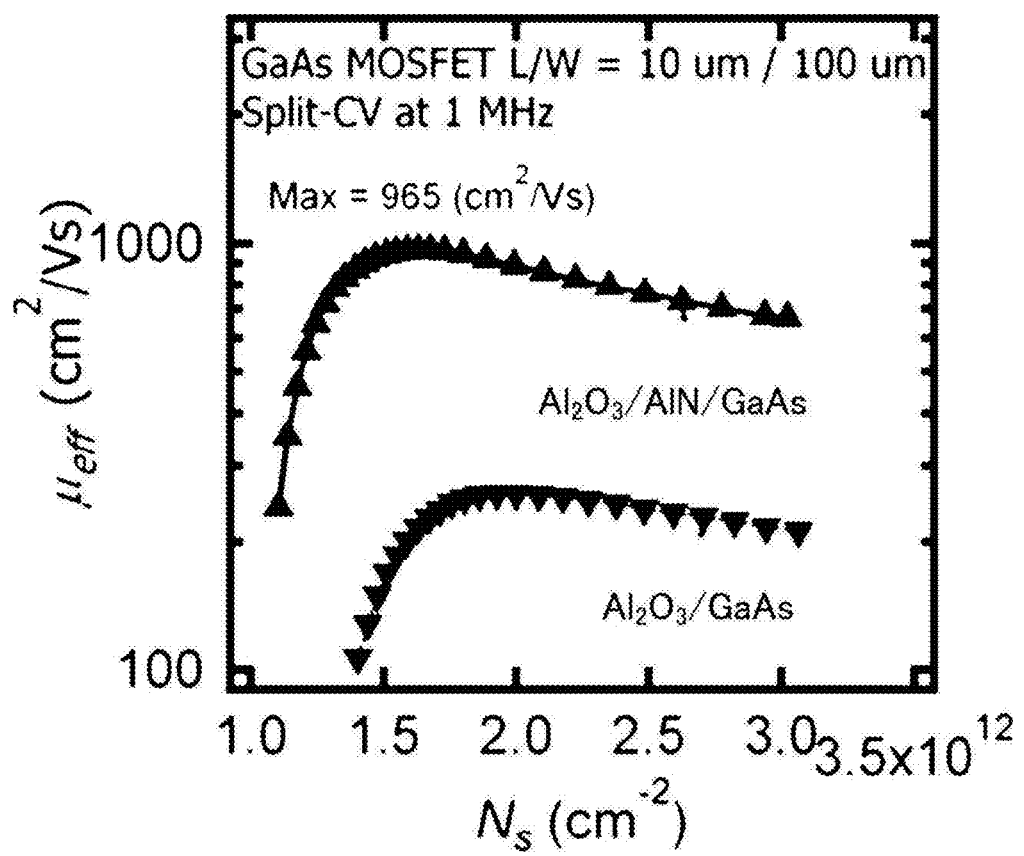

FIG. 33 is a graph showing the mobility ($\mu_{eff}$) of a MIS transistor.

Figure 34:
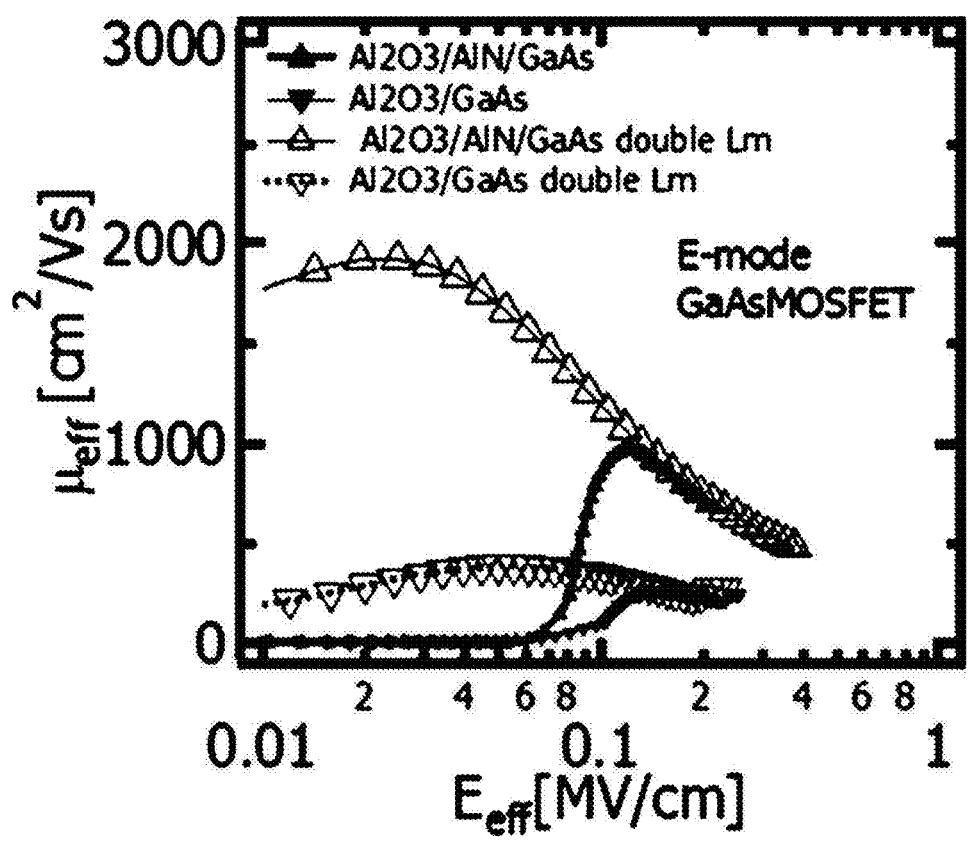

FIG. 34 is a graph showing the mobility ($\mu_{eff}$) of a MIS transistor.

FIG. 35 shows a cross-section of a semiconductor multilayer structure according to the fifth example.

Figure 36:
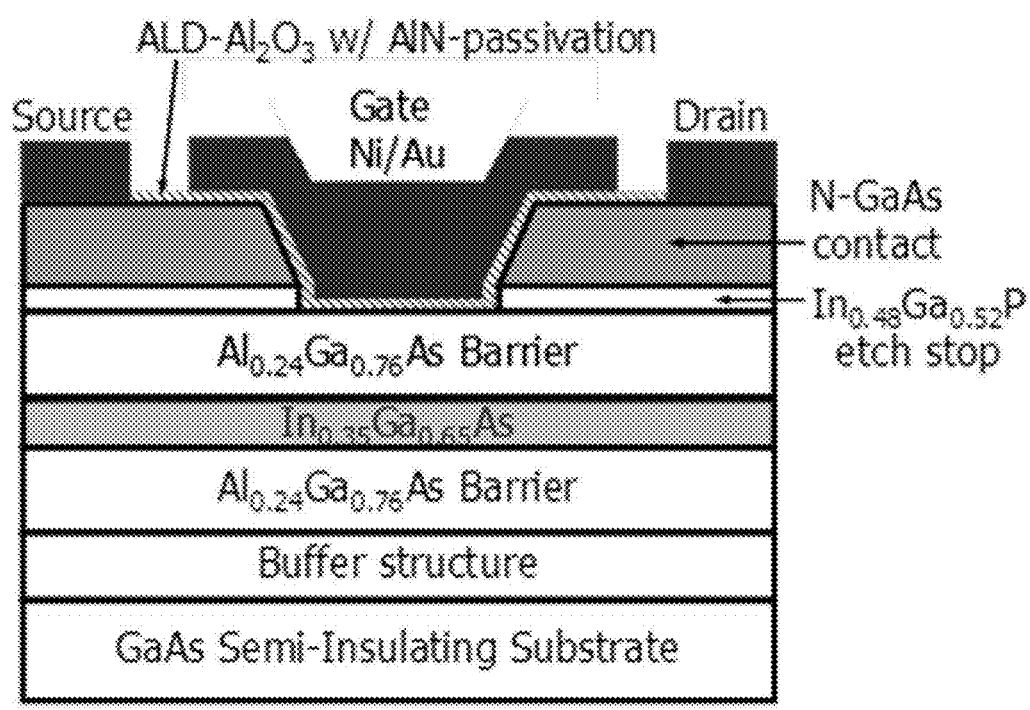

FIG. 36 shows a cross-section of a MOS gate-type PHEMT according to the fifth example.

Figure 37:
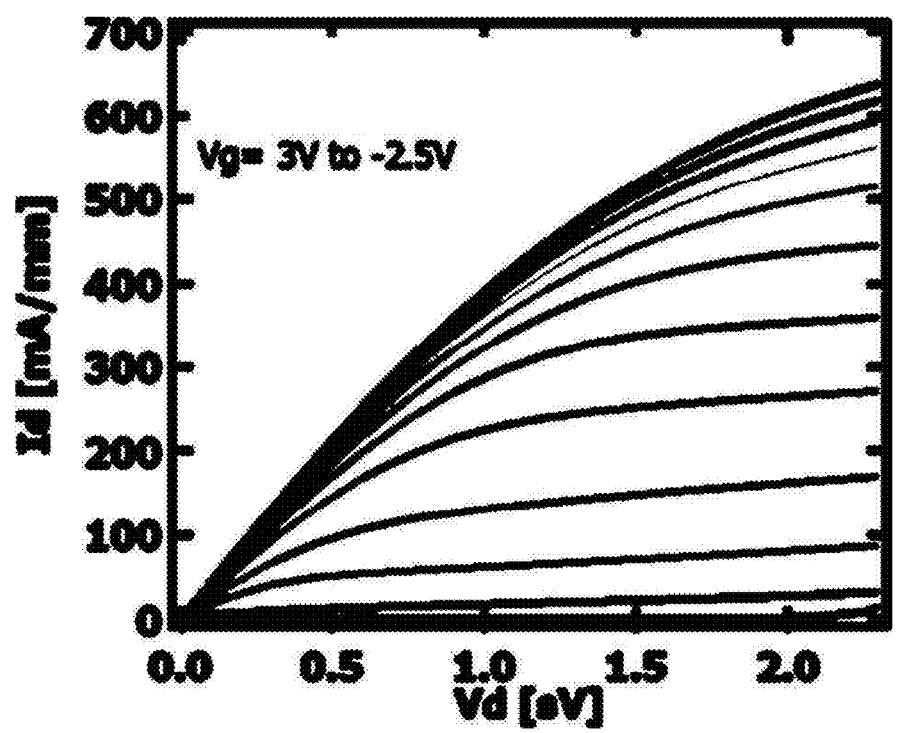

FIG. 37 shows the Id-Vd characteristics of an AlN/Al$_2$O$_3$ gate MOSPHEMT.

Figure 38:
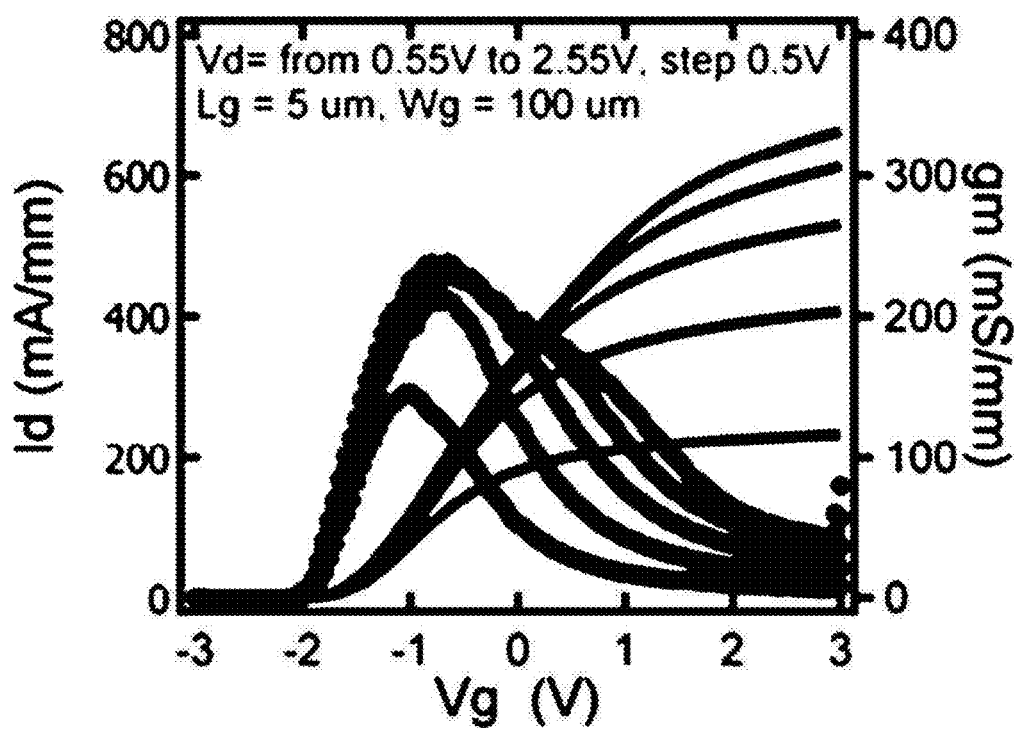

FIG. 38 shows the Id-Vg characteristics of an AlN/Al$_2$O$_3$ gate MOSPHEMT.

Figure 39:
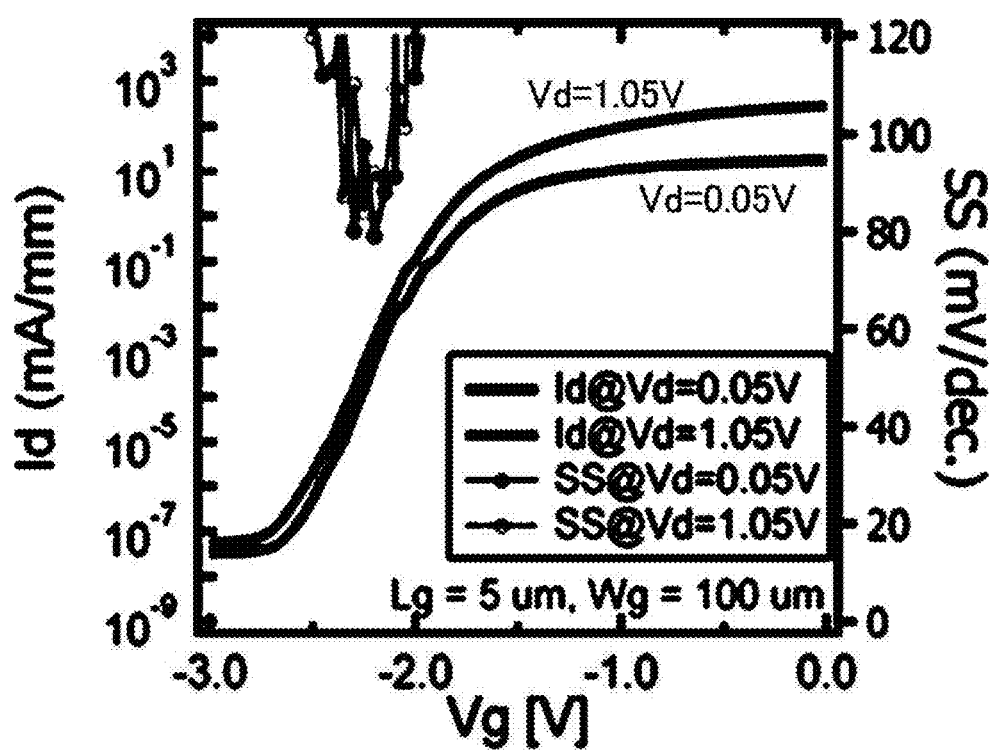

FIG. 39 shows the Id-Vg characteristics of an AlN/Al$_2$O$_3$ gate MOSPHEMT.

Figure 40:
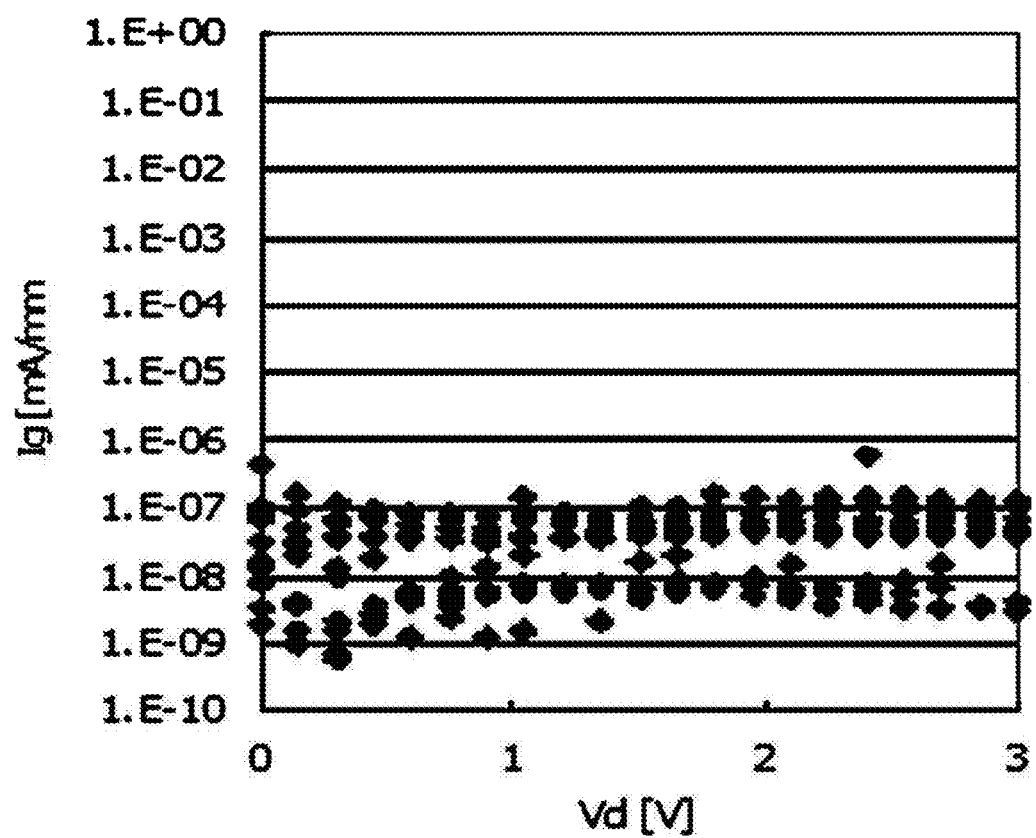

FIG. 40 shows the gate leak current Ig measured at the same time when the Id-Vd characteristics of FIG. 38 were measured.

Figure 41:
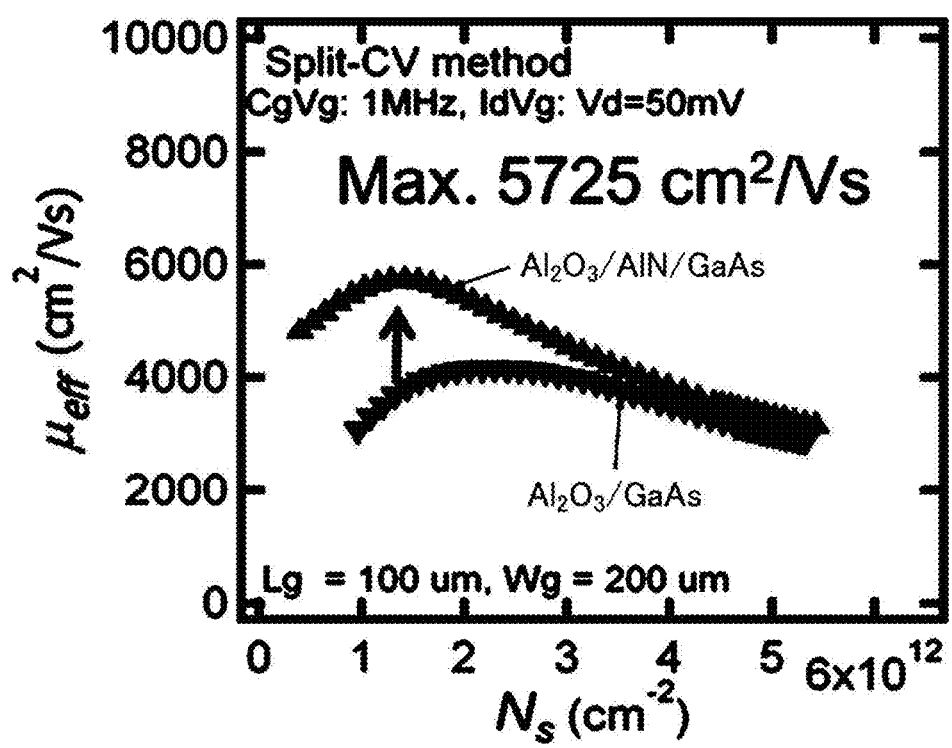

FIG. 41 shows a plot of the mobility-sheet carrier density calculated by the Split-CV method.

Figure 42:
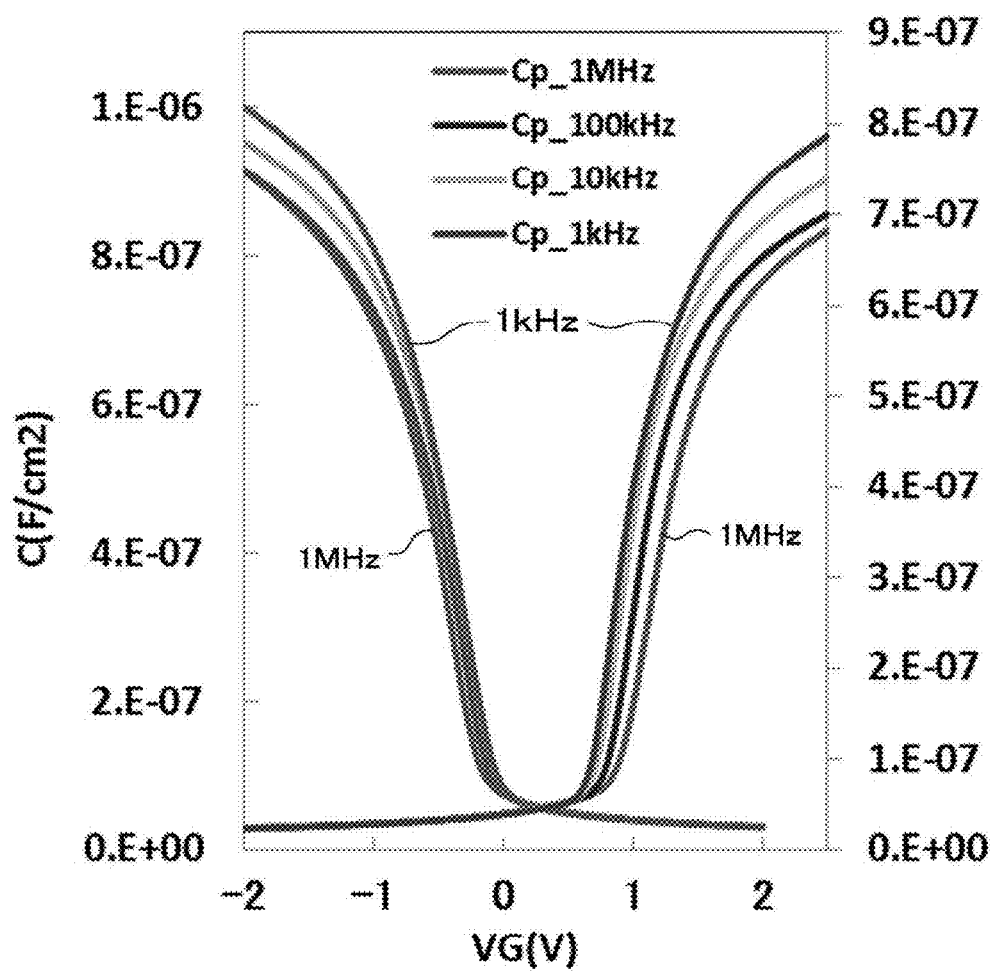

FIG. 42 shows the CV characteristics of the MOS capacitor according to the sixth example.

Figure 43:
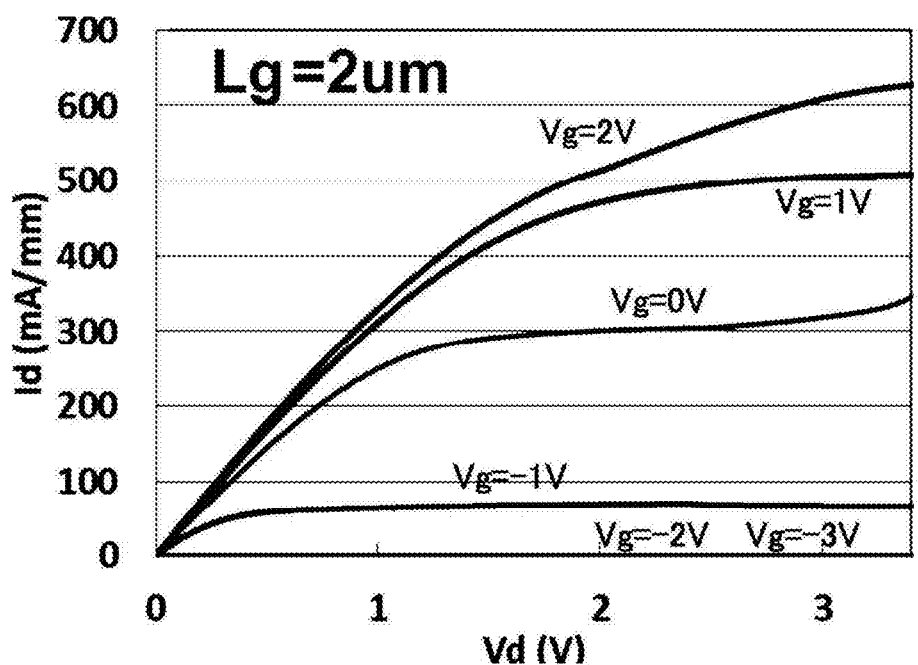

FIG. 43 shows the Id-Vd characteristics of a transistor according to the sixth example.

Figure 44:
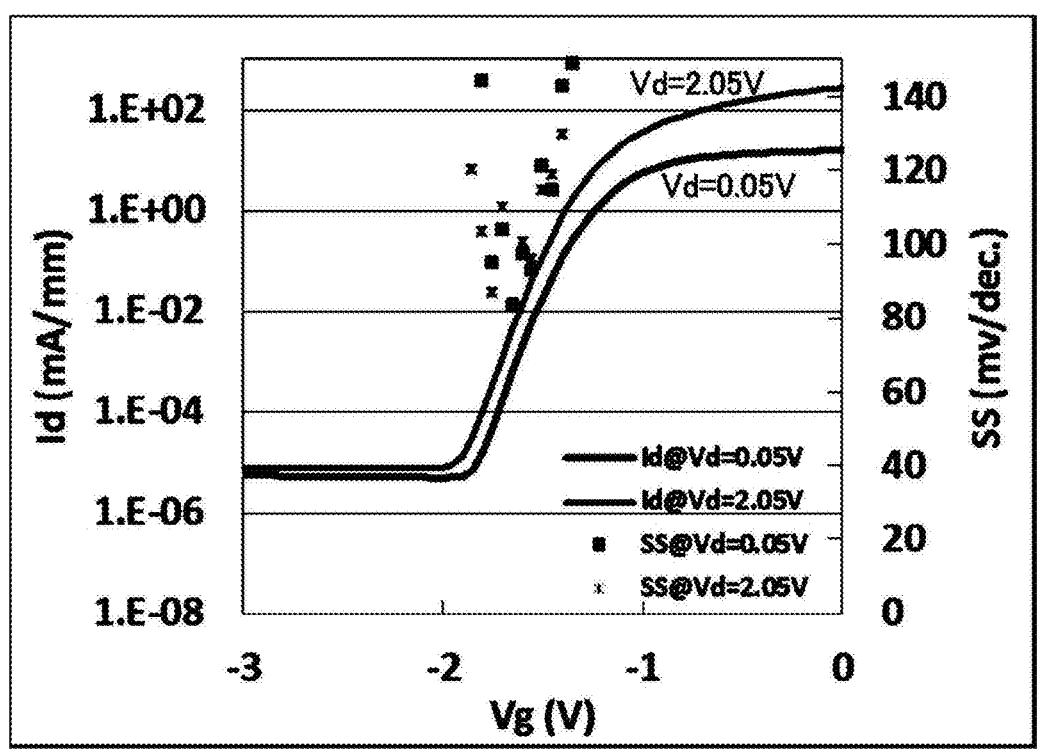

FIG. 44 shows the Id-Vg characteristics (logarithmic plot) of the transistor.

Figure 45:
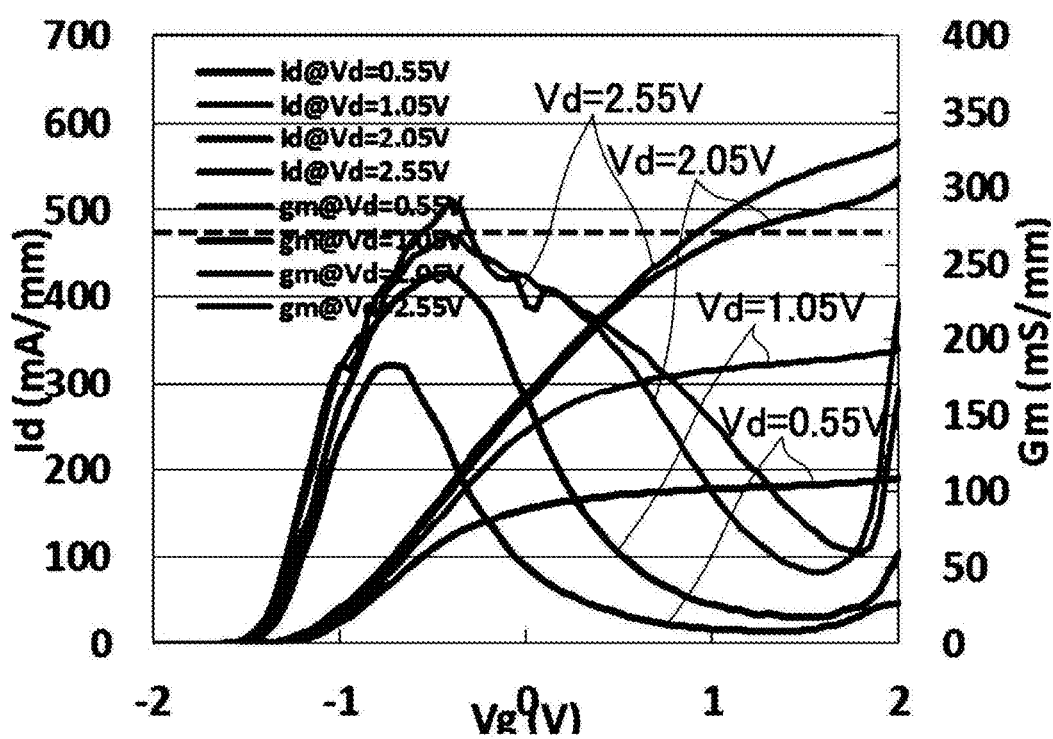

FIG. 45 shows the Id-Vg characteristics (linear plot) of the transistor.

Figure 46:
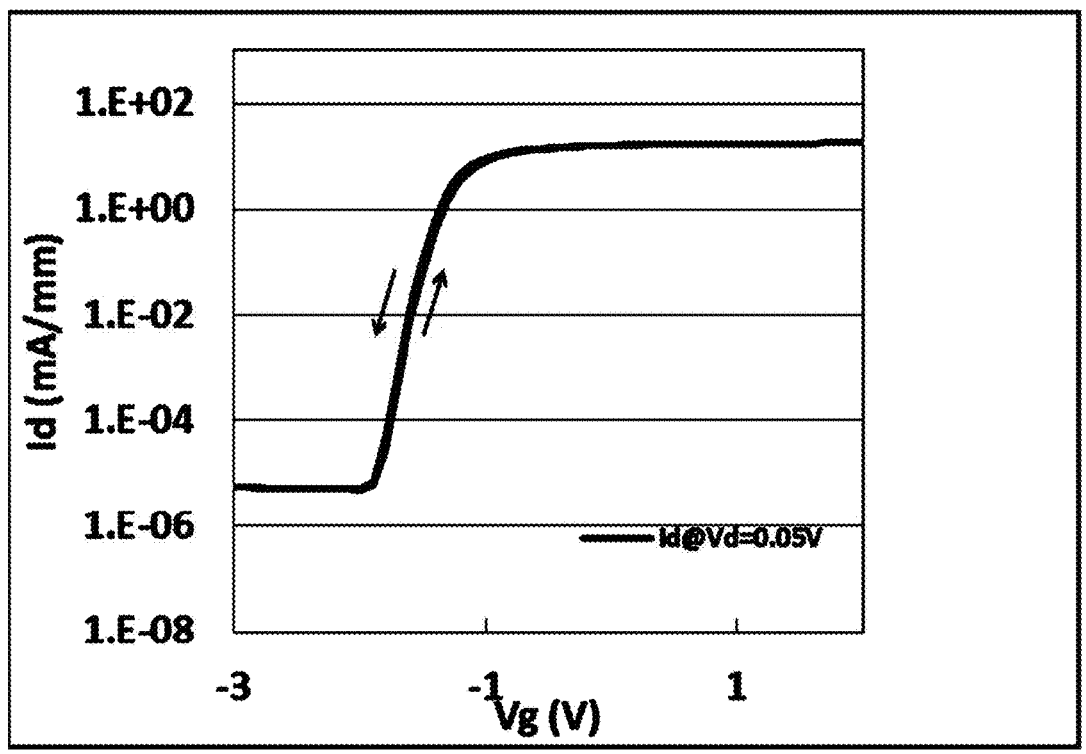

FIG. 46 shows the Id-Vg characteristics of the transistor when Vd=0.05 V.

Figure 47:
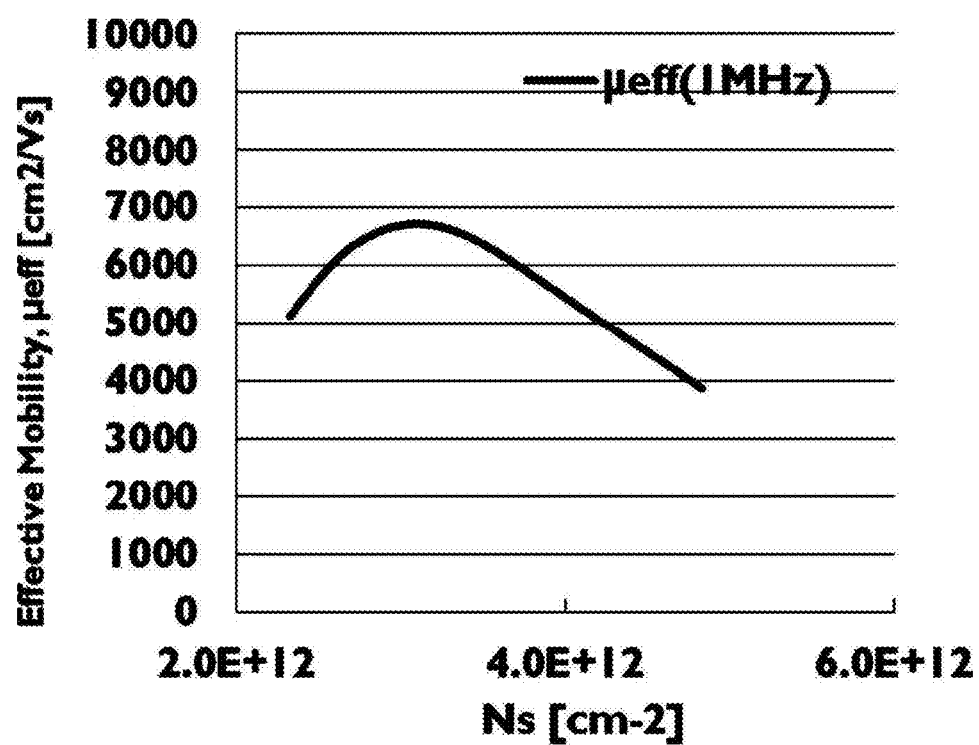

FIG. 47 shows the mobility-sheet carrier density plot of the transistor.

Figure 48:
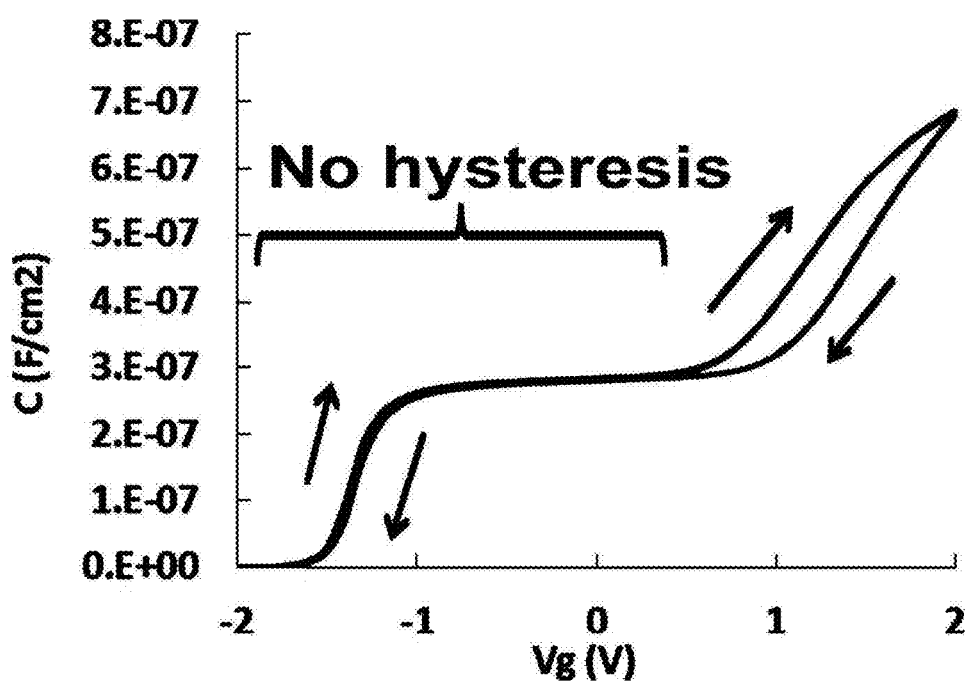

FIG. 48 shows the C-Vg characteristics of the transistor

Figure 49:
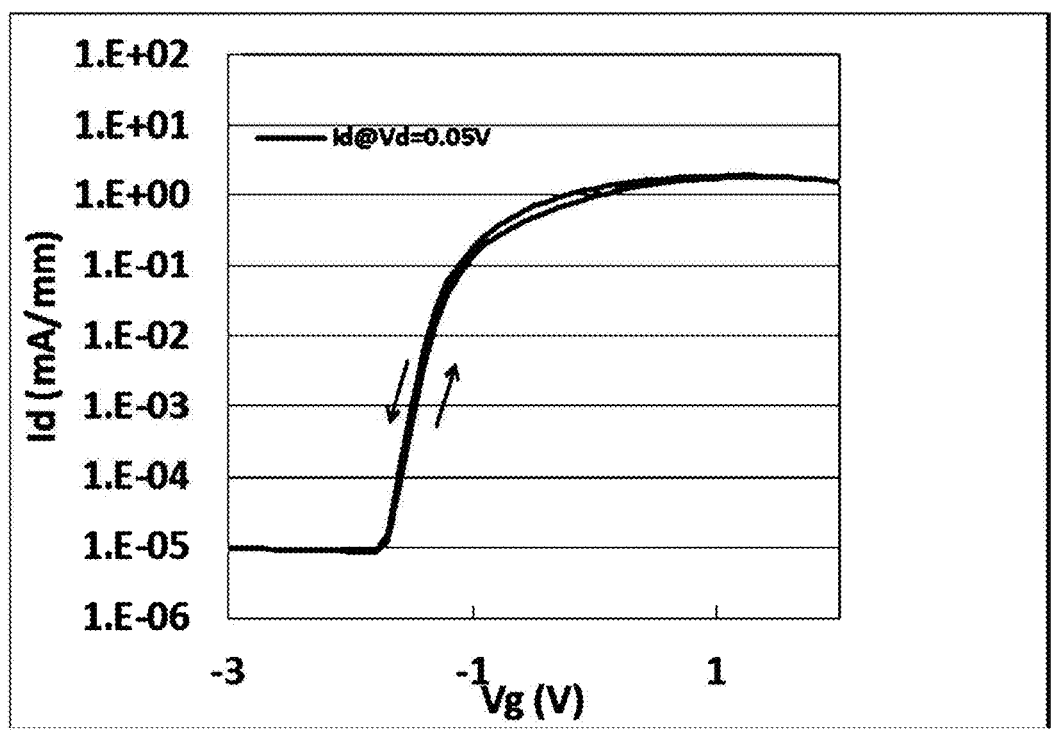

FIG. 49 shows the Id-Vg characteristics of the transistor.

Figure 50:
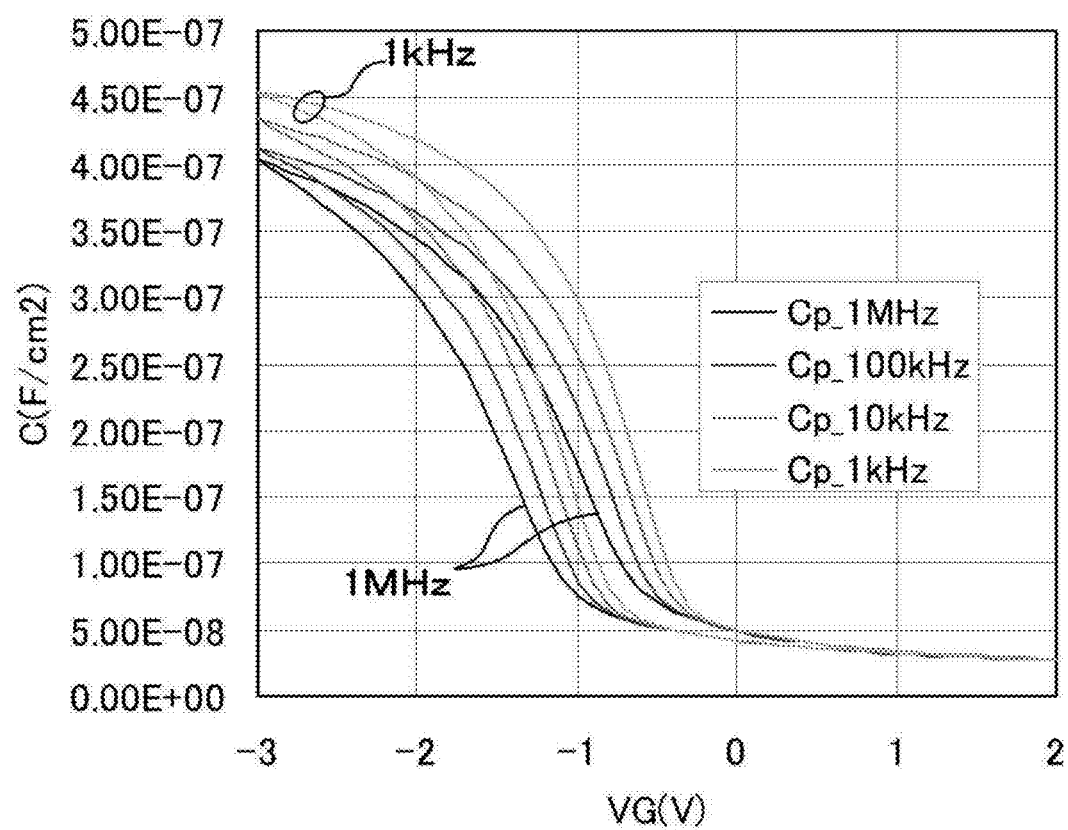

FIG. 50 shows the room temperature-CV characteristics of a MIS diode formed by using a semiconductor wafer according to the seventh example.

Figure 51:
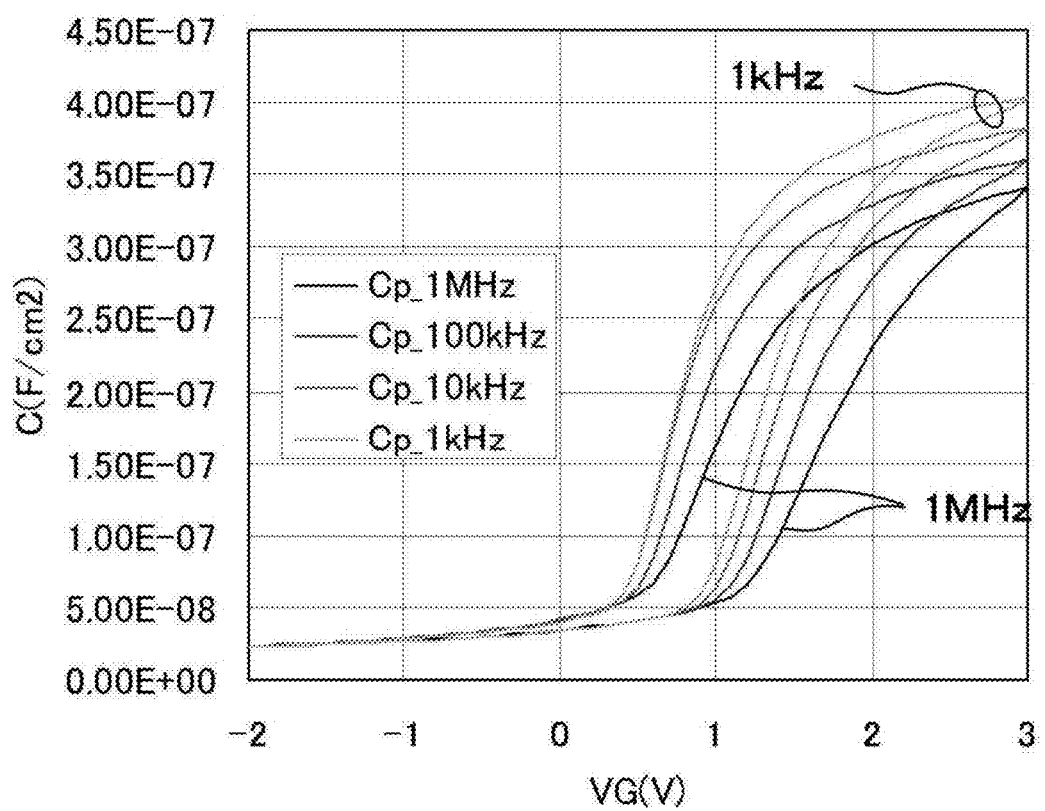

FIG. 51 shows the room temperature-CV characteristics of a MIS diode formed by using the semiconductor wafer according to the seventh example.

Figure 52:
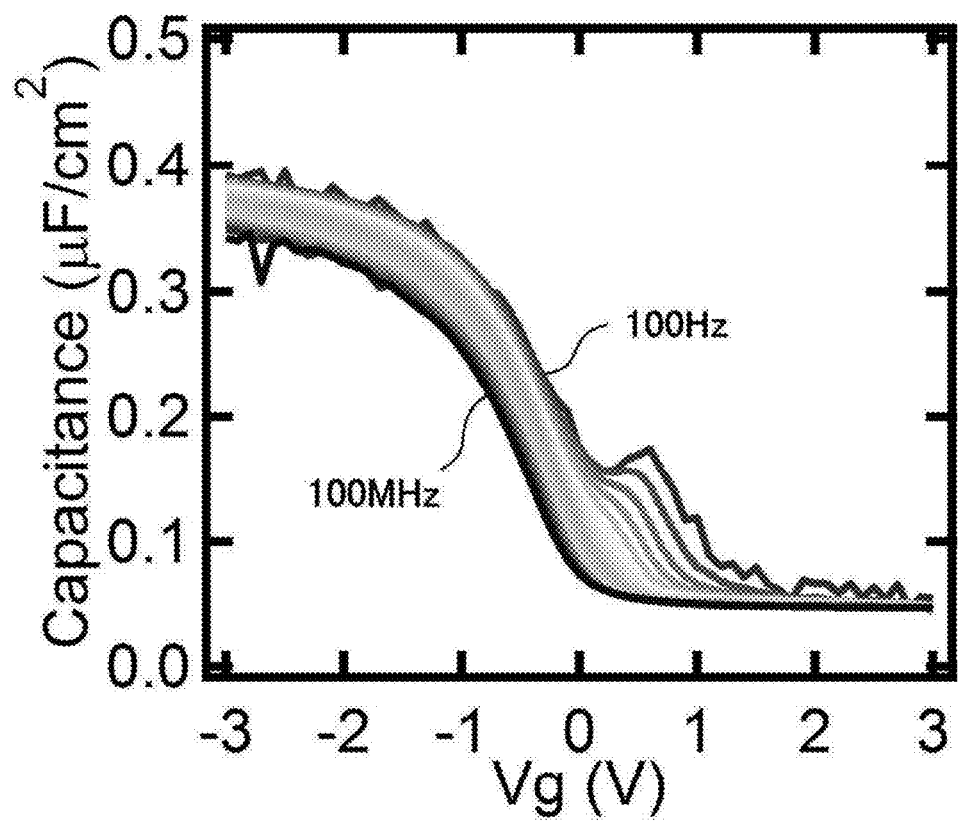

FIG. 52 shows the high temperature-CV characteristics of a MIS diode formed by using the semiconductor wafer according to the seventh example.

Figure 53:
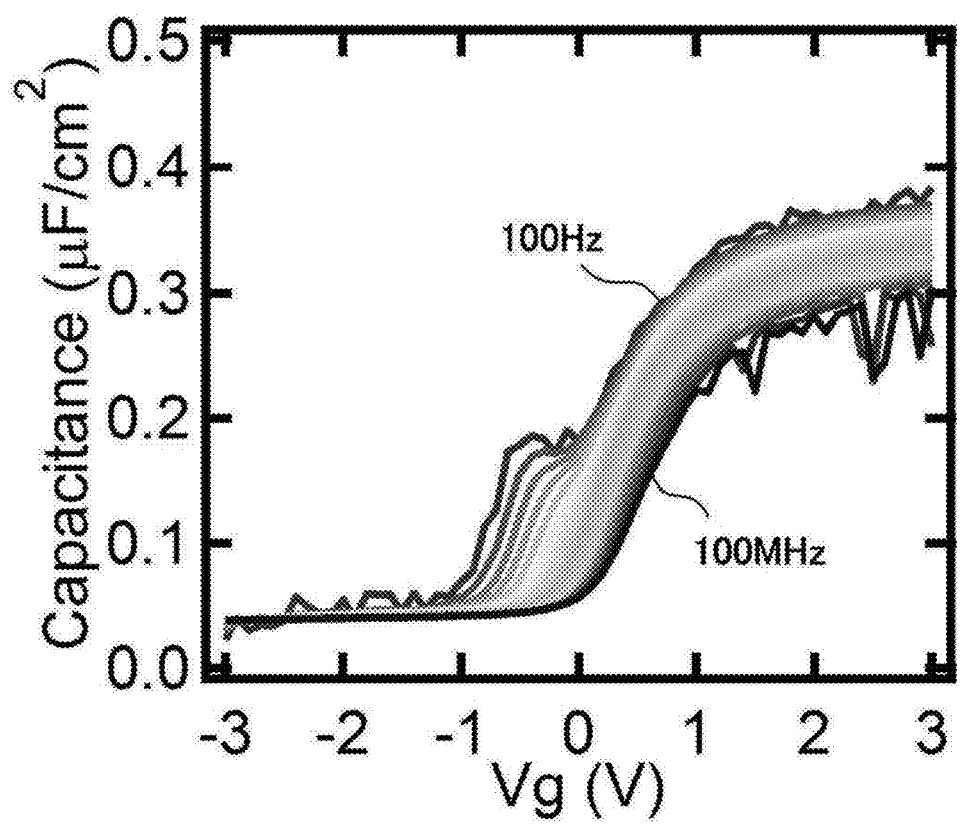

FIG. 53 shows the high temperature-CV characteristics of a MIS diode formed by using the semiconductor wafer according to the seventh example.

DESCRIPTION OF EXEMPLARY EMBODIMENTS

First Embodiment

Figure 1:
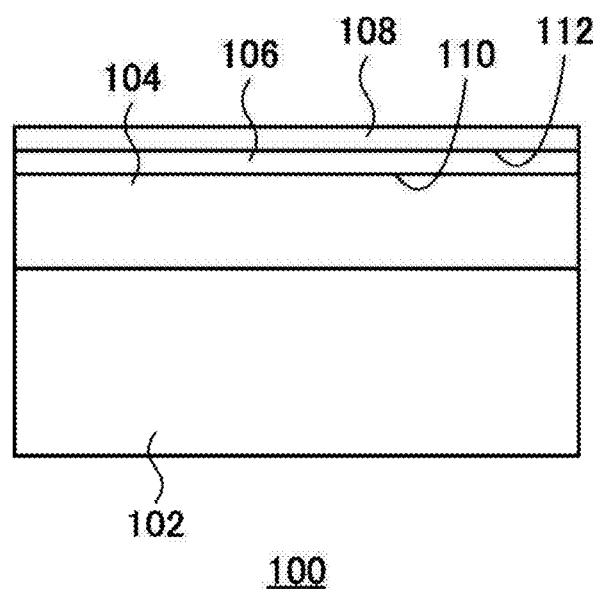
FIG. 1 is a cross sectional view showing a semiconductor wafer 100 according to a first embodiment.

FIG. 1 is a cross sectional view showing a semiconductor wafer 100 according to a present first embodiment. The semiconductor wafer 100 has a wafer 102, a compound semiconductor layer 104, a first insulating layer 106 and a second insulating layer 108. The wafer 102, the compound semiconductor layer 104, the first insulating layer 106 and the second insulating layer 108 are positioned in the order of the wafer 102, the compound semiconductor layer 104, the first insulating layer 106 and the second insulating layer 108.

The constituent material, size and the like of the wafer 102 are not limited as long as they provide the wafer 102 with a mechanical strength that can support the compound semiconductor layer 104 stably. As the wafer 102, an inorganic wafer such as a GaAs wafer, a Ge wafer, a sapphire wafer, a silicon wafer or a glass wafer, or an organic wafer such as plastic can be used. Also, a wafer made of a metal or the like can be used. However, a GaAs wafer, a Ge wafer, a sapphire wafer and a silicon wafer are preferred in terms of ensuring surface flatness. Also, a GaAs wafer, a Ge wafer and a sapphire wafer are more preferred as a wafer that allows epitaxial growth of the compound semiconductor layer 104. Note that the wafer 102 may be a compound semiconductor wafer that itself also serves the function of the compound semiconductor layer 104. Examples of such a wafer include a GaAs wafer, an InP wafer and the like. When an electronic device is formed by using the semiconductor wafer 100, the wafer 102 is preferably a SOI (Silicon on Insulator) or a GOI (Germanium on Insulator) in terms of being able to decrease stray capacitance of the electronic device and improve the operation speed. Specific preferred examples of the wafer 102 are shown below in the order of preferability as the wafer 102 as described above. That is, the most preferred wafer 102 is a GaAs wafer, next an InP wafer, next a SOI wafer and a GOI wafer, next a Si wafer and a Ge wafer, next a sapphire wafer, and lastly an inorganic wafer such as a glass wafer, an organic wafer such as plastic, and a wafer made of a metal or the like.

The compound semiconductor layer 104 is a semiconductor layer that functions as an active layer of an electronic device. The compound semiconductor layer 104 may be formed on the wafer 102 by epitaxial growth, or may be formed by transferring, on the wafer 102, of the compound semiconductor layer 104 that is epitaxially grown on another wafer for epitaxial growth.

The compound semiconductor layer 104 contains third atoms that are metallic atoms and fourth atoms that are non-metallic atoms. The third atoms are atoms contained in metal elements, that is, typical metal elements and transition metal elements. The third atoms include Al atoms, Ge atoms, Sb atoms, Po atoms, Ga atoms, Sn atoms, Bi atoms, Zn atoms, In atoms and Pb atoms. As the third atoms, Al atoms, Ge atoms, Ga atoms and In atoms are preferred, and Al atoms, Ga atoms and In atoms are more preferred. The fourth atoms are atoms other than metallic atoms, and include B atoms, Si atoms, As atoms, Te atoms, At atoms, C atoms, P atoms, Se atoms and I atoms. As the fourth atoms, Si atoms, As atoms, C atoms, P atoms and Se atoms are preferred, and As atoms and P atoms are more preferred.

The compound semiconductor layer 104 may be a single layer, or may be a hetero-junction layer consisting of multiple layers. When the compound semiconductor layer 104 is a heterojunction layer consisting of multiple layers, the compound semiconductor layer 104 can be applied as a two dimensional electron gas (2DEG) layer of a HEMT (High Electron Mobility Transistor) or a P-HEMT. Examples of the compound semiconductor layer 104 include a GaAs layer, an AlGaAs layer, an InGaAs layer, an InGaP layer, an InP layer, a GaN layer, a GaP layer, an AlInP layer, a GaAlP layer, an In$_x$Ga$_y$Al$_z$P$_{(1-x-y-z)}$ layer (0<x<1, 0<y<1, 0<z<1), and a hetero-junction layer consisting of a combination thereof. As the compound semiconductor layer 104, a GaAs layer, an AlGaAs layer, an InGaAs layer, an InGaP layer and a heterojunction layer consisting of a combination thereof are preferred in terms of enhancing epitaxial growth on a GaAs monocrystalline wafer.

The first insulating layer 106 and the second insulating layer 108 are layers that constitute an insulating layer of a MIS structure, and when applied to a MIS transistor, function as a gate insulating layer. The first insulating layer 106 contains: one or more first atoms selected from the group consisting of: all the metallic atoms, B atoms, Si atoms, As atoms, Te atoms, At atoms and P atoms; and oxygen atoms and nitrogen atoms. The second insulating layer 108 contains: one or more second atoms selected from the group consisting of all the metallic atoms; and oxygen atoms and nitrogen atoms. Then, in the depth direction that is from a surface of the second insulating layer 108 to the wafer 102, oxygen atoms and nitrogen atoms contained in the first insulating layer 106 and the second insulating layer 108 are distributed continuously in the second insulating layer 108, the first insulating layer 106 and the compound semiconductor layer 104. In the depth direction, the number of atoms per unit volume of nitrogen atoms contained in the first insulating layer 106 and the second insulating layer 108 shows its maximum in the first insulating layer 106. Also, the total number of atoms per unit volume of the third atoms and the fourth atoms along the depth direction becomes the largest in the compound semiconductor layer 104, and the number of atoms per unit volume of oxygen atoms at a first interface 110 which is the interface between the compound semiconductor layer 104 and the first insulating layer 106 is smaller than the number of atoms per unit volume of oxygen atoms at a second interface 112 which is the interface between the first insulating layer 106 and the second insulating layer 108.

Such a depth-direction profile of the first to fourth atoms, oxygen atoms and nitrogen atoms attribute to a method of producing the first insulating layer 106 and the second insulating layer 108. Because the depth profile of respective atoms is like the one described above, interface states of a MIS structure can be reduced.

Note that because of the above-described depth profile, interfaces (especially, the second interface 112) are not rapidly-changing interfaces, but ambiguous interfaces where materials constituting each layer are diffused relative to each other. Therefore, in the present specification, interfaces are defined as follows. That is, the first interface 110 refers to a surface positioned at a depth where the average number of atoms per unit volume of the third atoms and the fourth atoms in the depth direction decreases to a half of its largest value, and the second interface 112 refers to a surface, on the second insulating layer 108-side, positioned at a depth where the number of atoms per unit volume of nitrogen atoms in the depth direction decreases to a half of its maximum value.

The first atoms and the second atoms may be insulating layer-constituting metallic atoms consisting of homogeneous elements. In this case, in the depth direction, the insulating layer-constituting metallic atoms, oxygen atoms and nitrogen atoms are distributed continuously in the second insulating layer 108, the first insulating layer 106 and the compound semiconductor layer 104. Also, the number of atoms per unit volume of the insulating layer-constituting metallic atoms at the first interface 110 is preferably smaller than the number of atoms per unit volume of the insulating layer-constituting metallic atoms at the second interface 112.

The number of atoms per unit volume of the third atoms at the first interface 110 is preferably larger than the number of atoms per unit volume of the third atoms at the second interface 112, and the number of atoms per unit volume of the fourth atoms at the first interface 110 is preferably larger than the number of atoms per unit volume of the fourth atoms at the second interface 112. Also, the number of atoms per unit volume of nitrogen atoms in the second insulating layer 108 along the depth direction preferably increases as the depth increases. The number of atoms per unit volume of nitrogen atoms in the compound semiconductor layer 104 along the depth direction preferably decreases as the depth increases.

The third atoms and the fourth atoms may be present in the first insulating layer 106, and in this case, the number of atoms per unit volume of the third atoms and the fourth atoms in the first insulating layer 106 along the depth direction preferably increases as the depth increases.

Examples of the first atoms include one or more atoms selected from the group consisting of Al atoms, Ga atoms, In atoms, Ti atoms, Zr atoms, Hf atoms, Gd atoms, Er atoms, B atoms, Si atoms, As atoms, Te atoms, At atoms and P atoms. As the first atoms, one or more atoms selected from the group consisting of Al atoms, Ga atoms, In atoms, Ti atoms, Zr atoms, Hf atoms, Gd atoms, Er atoms, B atoms, Si atoms, As atoms and P atoms are preferred. More preferably, examples of the first atoms include one or more atoms selected from the group consisting of Al atoms, Ga atoms, In atoms, Hf atoms, Gd atoms, As atoms and P atoms. Further preferably, examples of the first atoms include one or more atoms selected from the group consisting of Al atoms, Ga atoms and As atoms.

Examples of the second atoms include one or more atoms selected from the group consisting of Al atoms, Ga atoms, In atoms, Ti atoms, Zr atoms, Hf atoms, Gd atoms and Er atoms. As the second atoms, one or more atoms selected from the group consisting of Al atoms, Ga atoms, In atoms, Hf atoms and Gd atoms are preferred. More preferably, examples of the second atoms include one or more atoms selected from the group consisting of Al atoms and Ga atoms.

Examples of a combination of the first atoms and the second atoms include a combination of: the first atoms that are one or more atoms selected from the group consisting of Al atoms, Ga atoms, Hf atoms, Gd atoms, As atoms and P atoms; and the second atoms that are one or more atoms selected from the group consisting of Al atoms, Ga atoms, Hf atoms and Gd atoms. As a combination of the first atoms and the second atoms, a combination of: the one or more first atoms selected from the group consisting of Al atoms, Ga atoms and As atoms; and the one or more second atoms selected from the group consisting of Al atoms and Ga atoms. More preferably, Al atoms as the first atoms and Al atoms as the second atoms are combined.

The first insulating layer 106 and the second insulating layer 108 may contain hydrogen atoms. In this case, the largest value of the number of atoms per unit volume of hydrogen atoms in the first insulating layer 106 is preferably larger than the largest value of the number of atoms per unit volume of hydrogen atoms in the second insulating layer 108. By making the first insulating layer 106 contain a large number of hydrogen atoms, the dangling bond that is present near the first interface 110 can be terminated by the hydrogen atoms, and interface states due to the dangling bond can be reduced.

Note that, in the present specification, when the phrase "the number of atoms per unit volume" is used, it refers to the number of atoms in a microregion in the depth direction. Also, in the present specification, metallic atoms refer to atoms that correspond to each among a plurality of elements that are classified as the metal elements.

The semiconductor wafer 100 can be produced as follows. That is, the compound semiconductor layer 104 is formed on the wafer 102; the first insulating layer 106 is formed on the compound semiconductor layer 104 by CVD by using a first gas and a second gas as source gases, and at the wafer 102-temperature of 250° C. or higher and 450° C. or lower; and after forming the first insulating layer 106, the second insulating layer 108 is formed by ALD by using a third gas and a fourth gas. Here, the first gas is a gas containing a gaseous compound of the first atoms, the second gas is one or more gases selected from the group consisting of gaseous nitrogen compounds and nitrogen molecules, the third gas is a gas containing a gaseous compound of the second atoms, the fourth gas is one or more gases selected from the group consisting of gaseous oxygen compounds and oxygen molecules.

The first atoms are, as described above, one or more atoms selected from the group consisting of all the metallic atoms, B atoms, Si atoms, As atoms, Te atoms, At atoms and P atoms, and the second atoms are one or more atoms selected from the group consisting of all the metallic atoms. The compound of the first atoms may contain, in addition to the first atoms, N atoms, O atoms and H atoms. Examples of the compound of the first atoms include an organic metallic compound having an appropriate vapor pressure. Examples of such an organic metallic compound include TMGa (trimethylgallium), TMA (trimethylaluminum) and TMIn (trimethylindium). The compound of the second atoms may contain, in addition to the second atoms, N atoms, O atoms and H atoms. Examples of the compound of the second atoms include an organic metallic compound having an appropriate vapor pressure. Examples of such an organic metallic compound include TMGa (trimethylgallium), TMA (trimethylaluminum) and TMIn (trimethylindium). Both the first insulating layer and the second insulating layer can be formed by CVD or ALD.

The compound semiconductor layer 104 can be formed by epitaxial growth or ALD. For epitaxial growth, MOCVD (Metal Organic Chemical Vapor Deposition) or MBE (Molecular Beam Epitaxy) can be used. When the compound semiconductor layer 104 consists of a Group III-V compound semiconductor and is formed by MOCVD, TMGa (trimethylgallium), TMA (trimethylaluminum), TMIn (trimethylindium), $AsH_3$ (arsin), $PH_3$ (phosphine) or the like can be used as the source gas. When the compound semiconductor layer 104 consists of a Group IV compound semiconductor and is formed by CVD, $GeH_4$ (germane), $SiH_4$ (silane), $Si_2H_6$ (disilane) or the like can be used as the source gas. Hydrogen can be used as the carrier gas. A compound that is obtained by replacing a part of a plurality of hydrogen atoms of the source gas with chlorine atoms or hydrocarbon radicals can also be used. The reaction temperature can be selected from among temperatures in the range of 300 to 900° C., and preferably in the range from 400 to 800° C. as appropriate. The thickness of the compound semiconductor layer 104 can be controlled by selecting the source gas supply amount and the reaction time as appropriate.

The first insulating layer 106 can be formed by ALD or LT-CVD by using $NH_3$ and organic metals (for example, TMA) as source materials. The reaction temperature is preferably a relatively low temperature that is 250° C. or higher and 450° C. or lower. Because the first insulating layer 106 is formed at a relatively low temperature of 250° C. or higher and 450° C. or lower, the growth rate is low, and control of the thickness becomes easy. Also, this means that an organic metal gas is supplied at a relatively low temperature, and removal of native oxide on surfaces (so-called self-cleaning effect of TMA) can be expected. Because of low-temperature growth, degradation of a III-V surface due to $NH_3$ exposure is not significant.

Different from generally-used ALD (~0.1 Torr) and MBE that requires ultra-high vacuum, the first insulating layer 106 can be formed at a pressure that is close to the atmospheric pressure. Because the film-formation is possible at a pressure that is close to the atmospheric pressure, there is an advantage in terms of improvement in throughput and easiness to cope with increase in the wafer size. The pressure of a reactor is preferably 0.1 atm or higher and 1.5 atm or lower, and is more preferably equal to the atmospheric pressure. The pressure is a pressure that can be employed in a MOCVD equipment for producing a Group III-V compound semiconductor, and can be utilized in existing MOCVD equipment. Accordingly, formation of the compound semiconductor layer 104 and formation of the first insulating layer 106 can be performed by using the same equipment, and successively without exposure to the atmosphere. As a result of this, improvement in throughput, and prevention of surface contamination can be attempted.

The second insulating layer 108 is formed by ALD that is performed by alternately supplying oxidant (water or alcohol) and an organic metal (for example, TMA). The reaction temperature is preferably 250° C. or higher and 400° C. or lower. The growth rate (growth per cycle) can be in the range of 0.5 to 1.5 angstrom/cycle depending on the choice of source material of ALD. Note that preferably, after the first insulating layer 106 is formed, the second insulating layer 108 is formed successively without exposure to the atmosphere using the same equipment.

According to the above-described semiconductor wafer 100, a semiconductor wafer in which interface states are reduced, and which is suited for a high performance electronic device can be formed thanks to the composition of respective atoms having the above-described depth profile.

Second Embodiment

Figure 2:
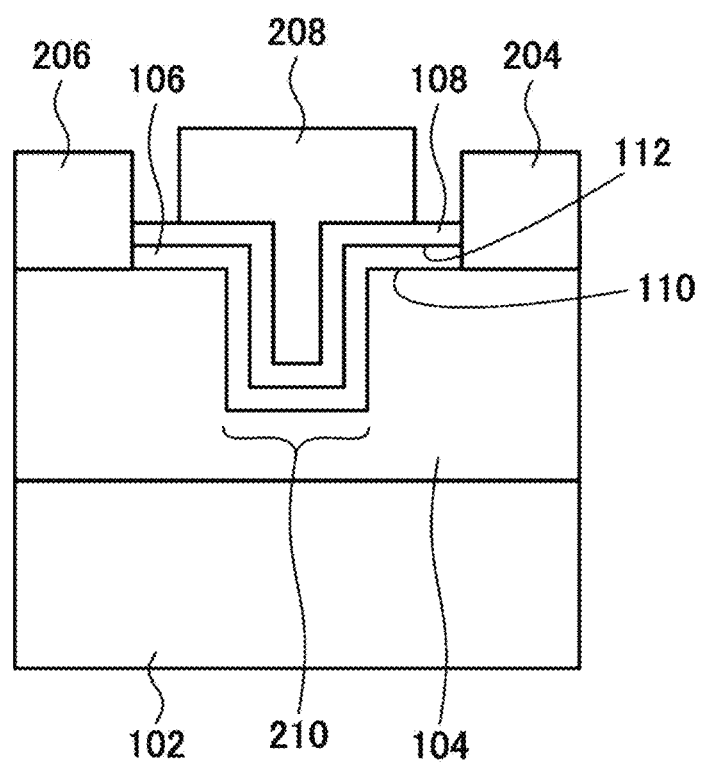
FIG. 2 is a cross sectional view showing an electronic device 200 according to a second embodiment.

FIG. 2 is a cross sectional view showing an electronic device 200 according to a second embodiment. The electronic device 200 has the semiconductor wafer 100 that is similar to the one explained in the first embodiment, a source electrode 204, a drain electrode 206 and a gate electrode 208. However, a recess structure 210 is formed in the compound semiconductor layer 104 of the electronic device 200, and the gate electrode 208 is positioned in the recess structure 210.

The compound semiconductor layer 104, the first insulating layer 106, the second insulating layer 108 and the gate electrode 208 are positioned in the order of the compound semiconductor layer 104, the first insulating layer 106, the second insulating layer 108 and the gate electrode 208. The source electrode 204 and the drain electrode 206 are positioned to sandwich the gate electrode 208 in the planar arrangement. Also, the source electrode 204 and the drain electrode 206 are electrically connected with the compound semiconductor layer 104.

The electronic device 200 can be produced as follows. That is, after forming the compound semiconductor layer 104 in a similar manner to that in the first embodiment, the recess structure 210 is formed on a surface of the compound semiconductor layer 104 by dry-etching or wet-etching. Thereafter, the first insulating layer 106 and the second insulating layer 108 are formed in a similar manner to that in the first embodiment, and post-annealing is performed as needed. After the first insulating layer 106 and the second insulating layer 108 in the source and drain formed regions are removed, the source electrode 204 and the drain electrode 206 are formed in contact with the source and drain regions. Furthermore, the gate electrode 208 is formed in the recess structure 210. Note that post-annealing may be performed after the source electrode 204 and the drain electrode 206 are formed.

Because in the electronic device 200, interface states between the compound semiconductor layer 104 and the first insulating layer 106 are reduced, a high performance MISFET can be formed. Note that a plurality of heterojunction layers can be applied to the compound semiconductor layer 104 to form a HEMT or P-HEMT having a MIS structure.

Instead of the electronic device 200, the following electronic device can be produced. That is, after the compound semiconductor layer 104 is formed in a similar manner to that in the first embodiment, the first insulating layer 106 and the second insulating layer 108 are formed in a similar manner to that in the first embodiment, and post-annealing is performed as needed. Thereafter, the gate electrode is formed, and portions of the first insulating layer 106 and the second insulating layer 108 that do not contact the gate electrode are removed by using the gate electrode as a mask. Thereafter, impurities are introduced to exposed portions of the compound semiconductor layer 104 by using the gate electrode as a mask, and the source and drain regions are formed. Furthermore, the source electrode and the drain electrode are formed in contact with the source and drain regions. In this manner, an electronic device to replace the electronic device 200 can be produced. Note that in the process of forming the source and drain regions, nickel alloy can be used, instead of introducing impurities. That is, nickel is vapor-deposited at exposed portions of the compound semiconductor layer 104 and heated to 200° C. or higher, resulting in formation of an alloy of a compound semiconductor and nickel. Thereafter, unreacted nickel is eliminated, and the source and drain regions can be formed.

Figure 3:
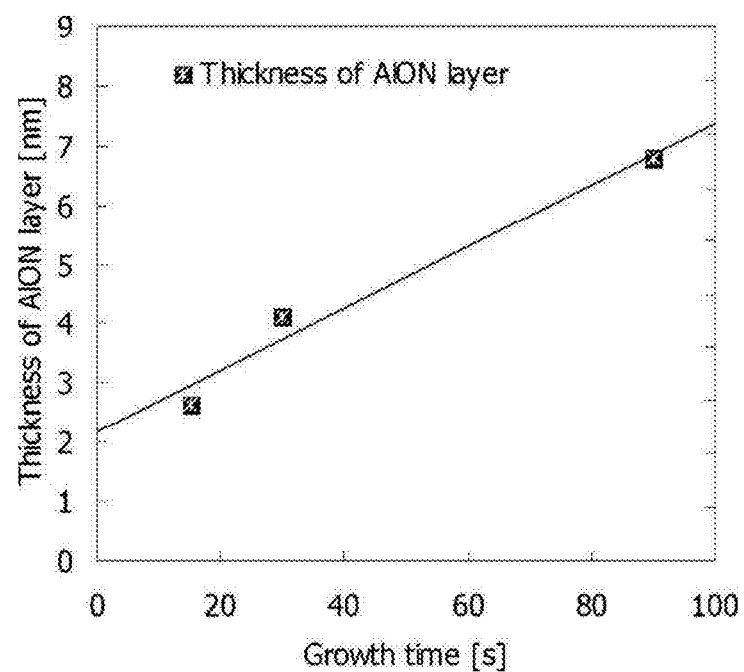
FIG. 3 shows a calibration curve showing a relationship between the design thickness of an AlN layer (growth time) and its actual thickness.

In the following examples, the thickness of an AlN layer is expressed as the design thickness. The design thickness is a thickness as designed that is calculated based on the growth rate and controlled with the reaction time, and the design thickness can be corrected to the actual thickness by using a calibration curve formed as a function of the thickness precisely measured for a plurality of samples and the growth time of the samples. FIG. 3 shows a calibration curve used in the following examples. The calibration curve of FIG. 3 was formed as follows. Three samples were formed with the growth time for the AlN layer of 15 seconds (design thickness=1 nm), 30 seconds (design thickness=1.94 nm) and 90 seconds (design thickness=5.82 nm), and each sample was subjected to the SIMS analysis. The thickness of the AlN layer was measured based on the depth profile of SIMS. The thicknesses of respective samples whose growth time was 15 seconds (design thickness=1 nm), 30 seconds (design thickness=1.94 nm) or 90 seconds (design thickness=5.82 nm) were 2.65 nm, 4.11 nm and 6.79 nm, respectively. The thickness of the sample whose growth time was 90 seconds (design thickness=5.82 nm) can also be measured by RBS (Rutherford Backscattering Spectrometry), and the value obtained by SIMS (6.79 nm) and the value obtained by RBS (6.68 nm) well matched.

First Example

GaAs wafers were applied as the wafer 102 and the compound semiconductor layer 104. Because the present invention is a technique that is applicable to Group III-V semiconductors in general, an effect of the present invention was demonstrated by using GaAs which is most generally used as Group III-V semiconductors In order to demonstrate improvement in the performance at MOS interfaces according to the present invention, a GaAs layer is used as the compound semiconductor layer 104 in the present first example.

A semiconductor wafer in which an AlN layer is applied as the first insulating layer 106 and an $Al_2O_3$ layer is applied as the second insulating layer 108 was formed. Note that because oxygen is contained in the first insulating layer 106 and nitrogen is contained in the second insulating layer 108, the AlN layer as the first insulating layer 106 and the $Al_2O_3$ layer as the second insulating layer 108 are not strictly a layer that is made of AlN and a layer that is made of $Al_2O_3$; however, they are called an AlN layer and an $Al_2O_3$ layer for convenience in the present first example and the following examples.

A specific method of producing the semiconductor wafer according to the first example is as follows. First, 1 μm-thick n⁻ GaAs ($4\times10^{16}$, Si dope) was formed on an n⁺ GaAs (001) wafer by MOCVD to prepare an N-type wafer. Also, 1 μm-thick p⁻ GaAs ($4\times10^{16}$, Zn dope) was formed on a p⁺ GaAs (001) wafer to prepare a P-type wafer. After removing a native oxide on the GaAs surface by ammonia aqueous solution-based surface treatment, the wafer was introduced into a MOCVD equipment for forming oxide films. Next, the AlN formation process was performed as follows. First, cleaning was performed under the conditions of a carrier gas of $N_2$, a reactor pressure of 1 atm and a reactor temperature of 400 to 600° C., and thereafter, the temperature was lowered to 400° C., and $NH_3$ and TMA were supplied to form an AlN layer. The growth rate of AlN was 0.65 angstrom/s, and the design thickness that was controlled based on time was 1 nm. After forming the AlN layer, the wafer was not taken out of the equipment, but successively, a 12.5-nm $Al_2O_3$ layer was formed by ALD. The formed AlN layer/$Al_2O_3$ layer structure was $AlO_xN_y$/$Al_2O_3$ by oxidation or mixing of the AlN layer by the ALD process. Here, "$AlO_xN_y$," means an aluminum oxynitride in general that contains oxygen and nitrogen as its composition, and the values of x and y may be any values that are larger than 0 and smaller than 1. Thereafter, the wafer was taken out, and post-deposition annealing was performed under the conditions of nitrogen atmosphere, 600° C. and 90 seconds. In the above-mentioned manner, the semiconductor wafer according to the first example was produced. Also, as a comparative example, a semiconductor wafer that did not have an AlN layer was produce in a similar manner to that in the first example under the same conditions except that the AlN formation process was not performed.

Figure 4:
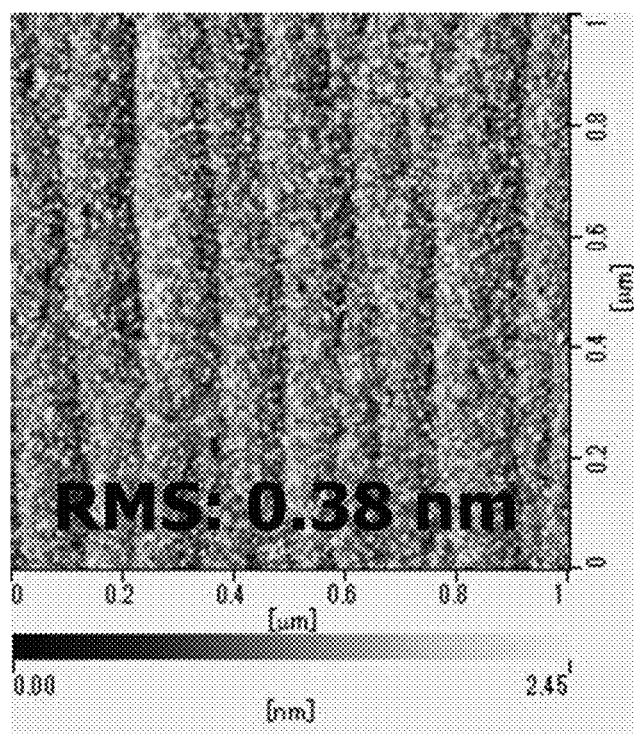
FIG. 4 is an AFM image for observing a surface of the semiconductor wafer according to a first example.

FIG. 4 is an AFM (Atomic Force Microscope) image for observing a surface of the semiconductor wafer according to the first example. The RMS (Root Mean Square) value of the surface roughness is 0.38 nm, and it can be known that it is sufficiently flat.

Figure 5:
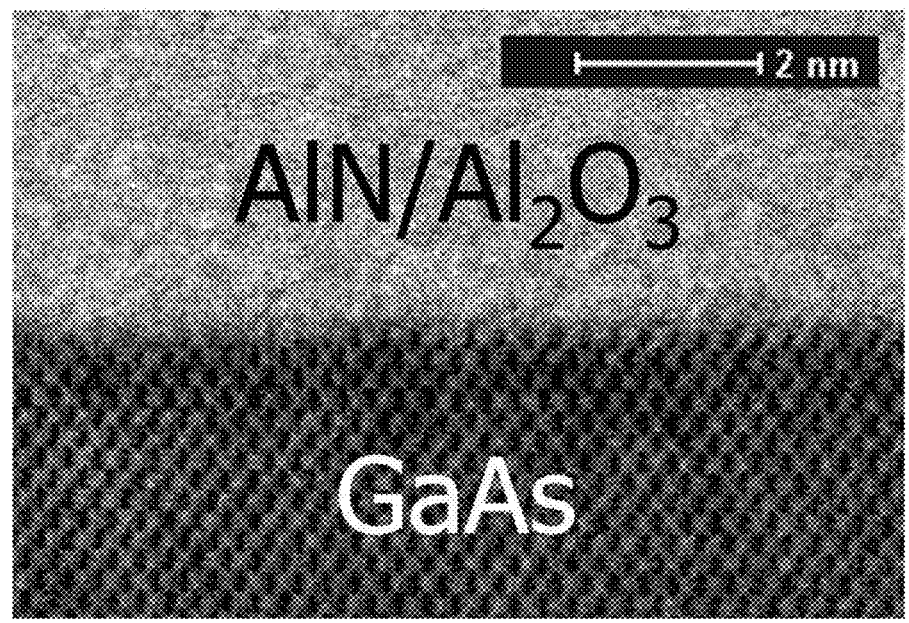
FIG. 5 is a STEM image for observing a cross-section of the semiconductor wafer according to the first example.
Figure 6:
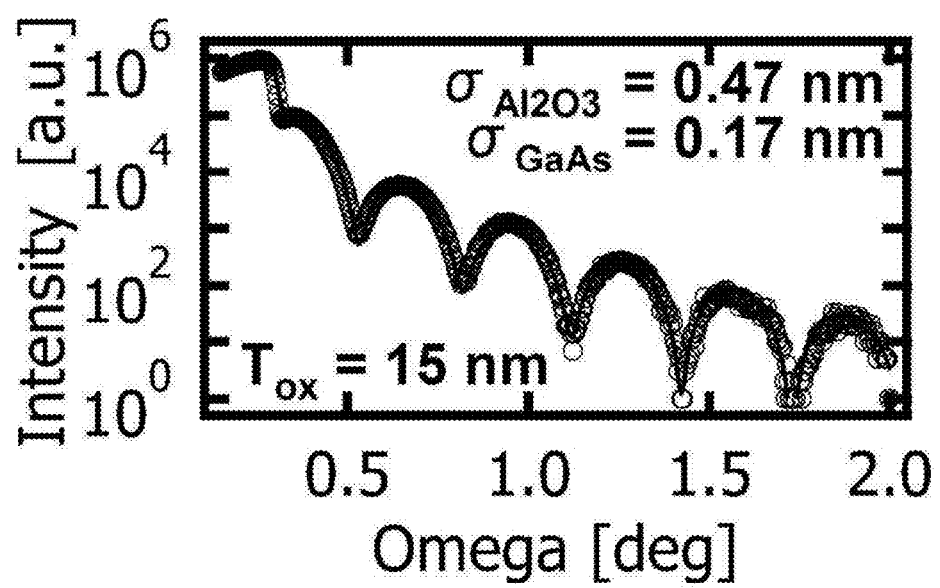
FIG. 6 shows results of observation, by XRR, of a surface of the semiconductor wafer according to the first example.

FIG. 5 is a STEM (Scanning Transmission Electron Microscope) image for observing a cross-section of the semiconductor wafer according to the first example, and FIG. 6 shows results of observation, by XRR (X-ray Reflectivity), of a surface of the semiconductor wafer according to the first example. It can be known from these results that flat and favorable surface and interface were formed.

Figure 7:
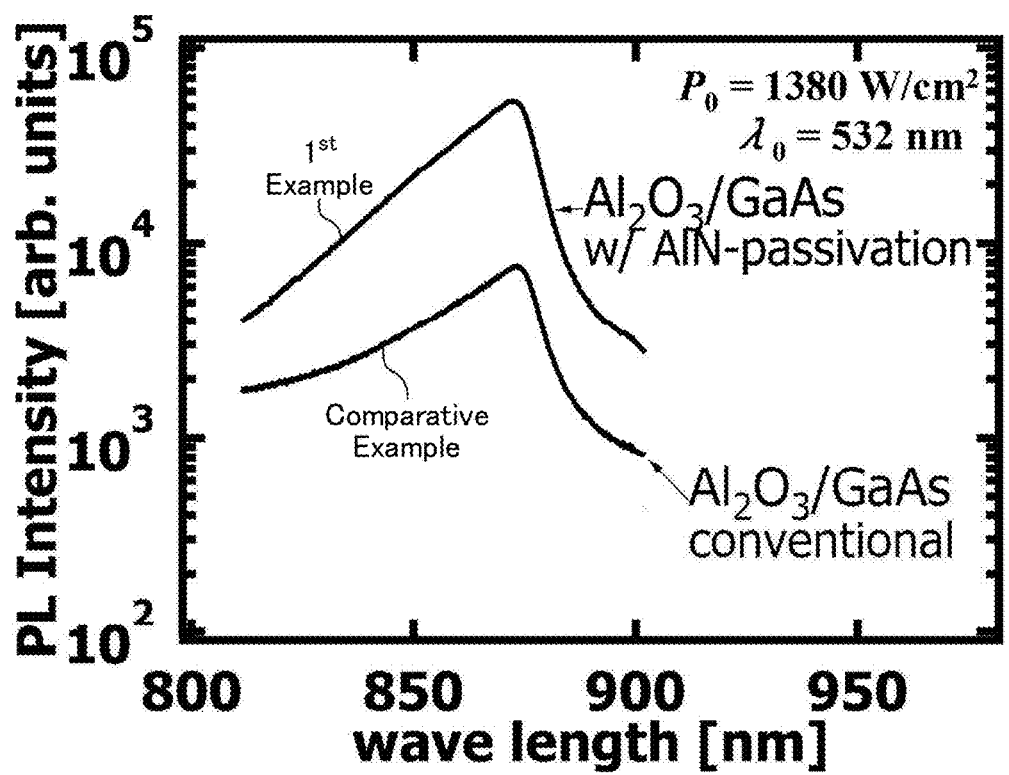
FIG. 7 shows results of PL spectrometry of the semiconductor wafer according to the first example. Results about a semiconductor wafer of a comparative example in which an AlN layer was not formed are shown as well.

FIG. 7 shows results of PL (Photo Luminescence) spectrometry of the semiconductor wafer according to the first example. Results about a semiconductor wafer of the comparative example in which an AlN layer was not formed are shown as well. It can be known that because as compared with the comparative example, the PL intensity of the semiconductor wafer according to the first example was high, the recombination velocity at the MOS interface became low, and the interface characteristics were improved.

Figure 8:
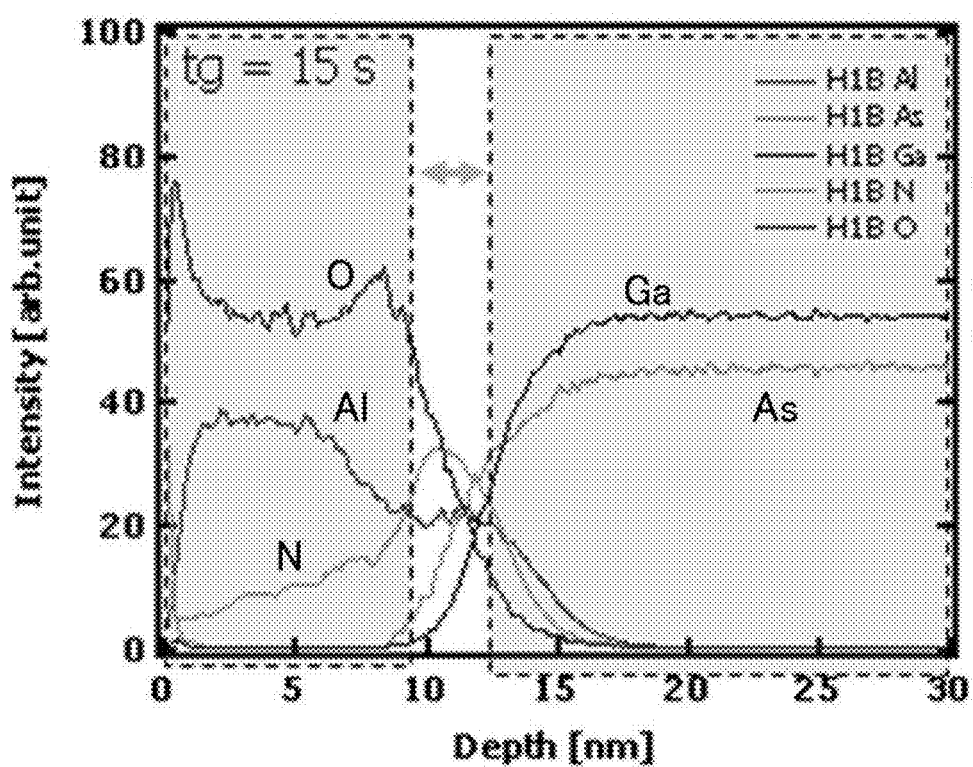
FIG. 8 shows the SIMS depth profile of the semiconductor wafer according to the first example.
Figure 9:
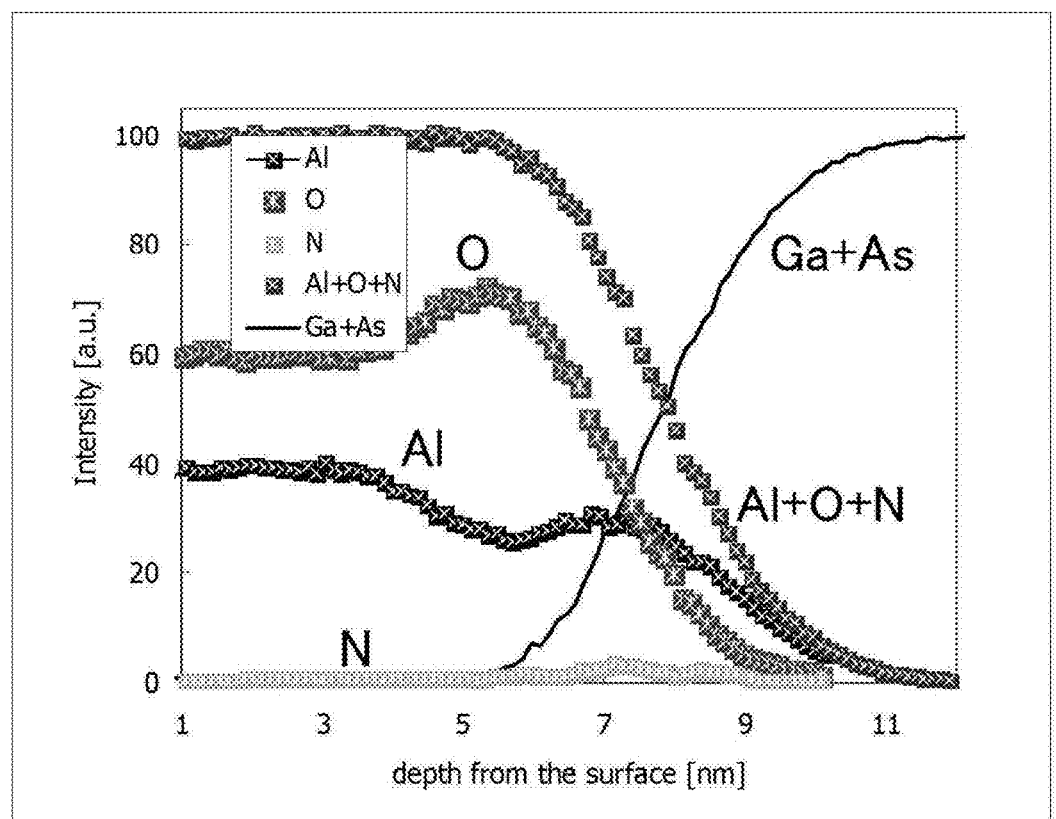
FIG. 9 shows the SIMS depth profile of a semiconductor wafer according to a comparative example.

FIG. 8 shows the SIMS depth profile of the semiconductor wafer according to the first example, and FIG. 9 shows the SIMS depth profile of the semiconductor wafer according to the comparative example. In FIG. 8, the values of the depth are corrected in accordance with the thickness of the entire insulating layer (AlN layer and $Al_2O_3$ layer) obtained by the ellipsometry.

While in the comparative example, almost no N atoms were observed in the $Al_2O_3$ layer to the GaAs wafer, in the semiconductor wafer according to the first example, N atoms could be observed in the AlN layer. O atoms, N atoms and Al atoms were distributed continuously from the $Al_2O_3$ layer to the GaAs wafer, and the number of atoms per unit volume of N atoms shows its maximum in the AlN layer. Furthermore, the numbers of Ga atoms and As atoms were the largest in the GaAs wafer, and the number of atoms per unit volume of O atoms at the interface between the GaAs wafer and the AlN layer (first interface) was smaller than the number of atoms per unit volume of O atoms at the interface between the AlN layer and the $Al_2O_3$ layer (second interface). Also, the number of atoms per unit volume of Al atoms at the first interface is smaller than that at the second interface, and the number of atoms per unit volume of Ga atoms and As atoms at the first interface is larger than that at the second interface. Also, the number of atoms per unit volume of N atoms in the $Al_2O_3$ layer increases as the depth increases, and the number of atoms per unit volume of N atoms in the GaAs wafer decreases as the depth increases. Furthermore, the number of atoms per unit volume of Ga atoms and As atoms in the AlN layer increases as the depth increases.

By using the semiconductor wafer according to the first example, the gate electrode (Au) was formed on the $Al_2O_3$ layer, and an ohmic electrode (AuGe/Ni/Au) was formed on the back side a GaAs substrate. Post-metallization annealing was performed under the conditions of hydrogen atmosphere, 420° C., and 90 seconds to produce a MIS diode by using the semiconductor wafer according to the first example.

Figure 10:
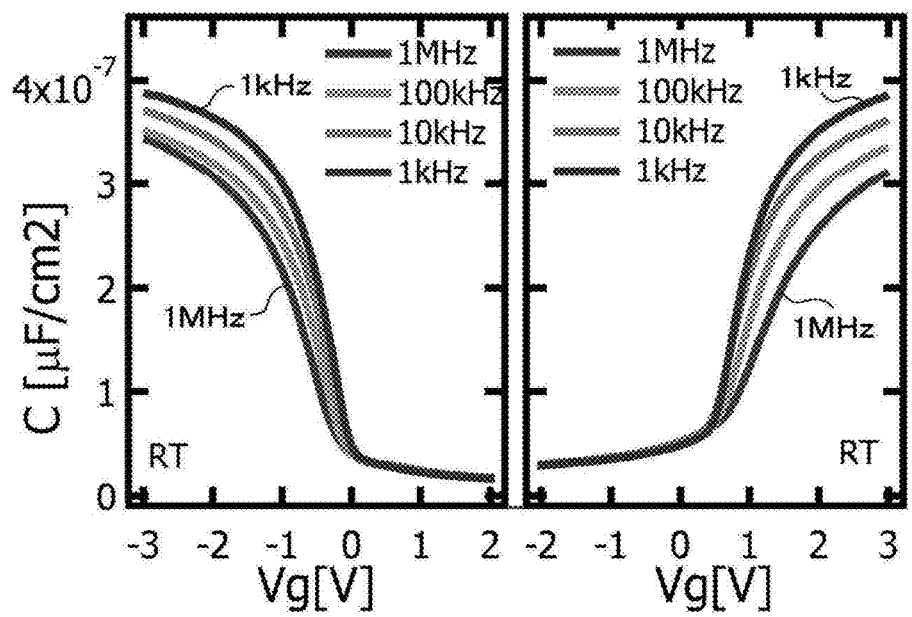
FIG. 10 shows the room temperature-CV characteristics of a MIS diode formed by using the semiconductor wafer according to the first example.

FIG. 10 shows the room temperature-CV characteristics of a MIS diode formed by using the semiconductor wafer according to the first example. FIG. 11 shows the room temperature-CV characteristics of a MIS diode formed by using the semiconductor wafer according to the comparative example. In FIG. 10 and FIG. 11, the left graphs show the room temperature-CV characteristics of a p-type wafer, and the right graphs show the room temperature-CV characteristics of an n-type wafer. It can be known that as compared with the comparative example, the frequency dispersion of the accumulation capacitance was improved in the semiconductor wafer according to the first example.

FIG. 12 shows the CV characteristics, at high-temperature (150° C.) (hereinafter, referred to as "high temperature-CV characteristics"), of a MIS diode formed by using the semiconductor wafer according to the first example. FIG. 13 shows the high temperature-CV characteristics of a MIS diode formed by using the semiconductor wafer according to the comparative example. In FIG. 12 and FIG. 13, the top graphs show the high temperature-CV characteristics of a p-type wafer, and the bottom graphs show high temperature-CV characteristics of an n-type wafer. It can be known that as compared with the comparative example, the humps in the depletion-inversion regions are considerably small in the semiconductor wafer according to the first example. Because the humps in the high temperature-CV characteristics is considered as reflecting a high interface state density in the mid-gap, it can be seen that the interface state density of the mid-gap is lowered considerably in the first example as compared with the comparative example.

FIG. 14 shows the room temperature-CV characteristics (left graphs) and room temperature-GV (GV: conductance-voltage) spectrum analysis map (right graphs) of a MIS diode formed by using the semiconductor wafer according to the first example. The top graphs show data about a p-type wafer, and the bottom graphs show data about an n-type wafer. FIG. 15 shows the high temperature-CV characteristics (left graphs) and high temperature-GV spectrum analysis map (right graphs) of a MIS diode formed by using the semiconductor wafer according to the first example. The top graphs shows data about a p-type wafer, and the bottom graphs show data about an n-type wafer. The dotted lines denoted with "Fermi-level trace" in FIG. 14 and FIG. 15 show shifts in Fermi-levels according to changes in gate bias, i.e., the behavior of Fermi-level pinning. For example, a large inclination of "Fermi-level trace" indicates that the Fermi-level shifts according to changes in the gate bias, and Fermi-level pinning is not occurring. Although FIG. 15, which shows results of high temperature-measurement, suggests that the Fermi-level is pinned slightly in the mid-gap, it can be known from the results of FIG. 14, which shows low temperature measurement, that the Fermi-level shifts smoothly according to changes in the gate bias in regions other than the mid-gap.

FIG. 16 is a graph that shows the interface state density (Dit) obtained by a conductance method from results of CV measurement performed on a MIS diode configured by using the semiconductor wafer according to the first example at room temperature, 60° C., 100° C. and 150° C., and the horizontal axis of the graph indicates energy from the conduction band. For comparison, the interface state density of the comparative example (without an AlN layer) that was obtained in a similar manner is shown. It can be known that as compared with the comparative example, the interface state density near the mid-gap was lowered in the semiconductor wafer according to the first example.

FIG. 17 shows the JV characteristics of a MIS diode formed by using the semiconductor wafer according to the first example. The plot where Vg is 0 V or lower shows data about a p-type wafer, and the plot where Vg is 0 V or higher shows data about an n-type wafer. It can be known that sufficiently low leak current was obtained.

Second Example

In the second example, a plurality of semiconductor wafers according to the first example in which the thicknesses of the AlN layers were changed was formed, and the dependence on AlN layer-thickness was examined. The thickness of the AlN layer was changed within the range of 0.1 to 10 nm, and nine types of semiconductor wafers having different AlN layer-design thicknesses were formed. The growth rate of AlN was set at 0.65 angstrom/s, and the AlN layers whose design thicknesses are 0.1 nm, 1 nm, 2 nm, 3 nm, 4 nm, 5 nm, 6 nm, 8 nm and 10 nm were formed by controlling time. Other conditions, etc. were similar to those in the first example.

FIG. 18 shows the SIMS depth profile of a semiconductor wafer with the AlN layer-design thickness of 2 nm, and FIG. 19 shows the SIMS depth profile of a semiconductor wafer with the AlN layer-design thickness of 6 nm. In FIG. 18 and FIG. 19, values of the depth were corrected in accordance with the thickness of the entire insulating layer ($AlN/Al_2O_3$) obtained by ellipsometry. It can be known that even when the thickness of the AlN layer is changed, the depth profile similar to that in the first example was obtained.

FIG. 20 shows the IV characteristics of a MIS diode when its AlN layer-design thickness was changed, the vertical axis indicates the current density, and the horizontal axis indicates the electric field intensity within the insulating layer. FIG. 21 shows the IV characteristics of a MIS diode when its AlN layer-design thickness was changed, the vertical axis indicates the current density, and the horizontal axis indicates the gate voltage (Vg). In FIG. 20 and FIG. 21, the left graphs correspond to the p-type wafer, and the right graphs correspond to the n-type wafer. Although it can be known that as the AlN layer-design thickness increases, the breakdown voltage (withstanding voltage breakdown strength) improved, it can be known that the leak current increases due to increase in defects, etc.

FIG. 22 shows a graph obtained by plotting, in relation to the thickness of the AlN layer, the frequency dispersion of the accumulation capacitance obtained from the room temperature-CV characteristics of the MIS diodes configured by using the semiconductor wafer whose AlN layer-design thickness was changed and the semiconductor wafer according to the comparative example. FIG. 23 shows a graph obtained by plotting, in relation to the thickness of the AlN layer, the frequency dispersion of flat band voltage obtained from the room temperature-CV characteristics of the MIS diodes configured by using the semiconductor wafer whose AlN layer-design thickness was changed and the semiconductor wafer according to the comparative example. FIG. 24 shows a graph obtained by plotting, in relation to the thickness of the AlN layer, the hysteresis at 1 kHz obtained from the room temperature-CV characteristics of the MIS diodes configured by using the semiconductor wafer whose AlN layer-design thickness was changed and the semiconductor wafer according to the comparative example. In FIG. 22 to FIG. 24, the levels of the comparative examples are indicated by dotted lines. As is obvious from the figures, there is an optimum thickness of the AlN layer, and an excessively thick AlN layer has large frequency dispersion of the accumulation capacitance and flat band voltage (especially in the case of n-type). Taking hysteresis also into consideration, a suitable thickness of the AlN layer thickness (design thickness) is about 3 to 6 nm.

Note that according to the RBS measurement of the semiconductor wafer having the AlN layer-design thickness of 6 nm, the highest composition ratio of nitrogen within the AlN layer was 28.4%. Also, according to the SIMS analysis, while the hydrogen concentration within the $Al_2O_3$ layer of the comparative example was $6.7 \times 10^{20}$ atoms/cc, the hydrogen concentration within the AlN layer in the semiconductor wafers having the AlN layer-design thicknesses of 1 nm and 6 nm was as high as 1.70 to $1.75 \times 10^{21}$ atoms/cc.

Third Example

A semiconductor wafer according to the third example was formed in a similar manner to that in the first example except for that the AlN layer-design thickness was 1 nm, and the AlN layer formation temperature was changed within the range of 250 to 550° C. FIG. 25 shows the room temperature-CV characteristics (left) and high temperature-CV characteristics (right) of a MIS diode for which the AlN layer formation temperature was 250° C. FIG. 26 shows the room temperature-CV characteristics (left) and high temperature-CV characteristics (right) of a MIS diode for which the AlN layer formation temperature was 300° C. FIG. 27 shows the room temperature-CV characteristics (left) and high temperature-CV characteristics (right) of a MIS diode for which the AlN layer formation temperature was 350° C. FIG. 28 shows the room temperature-CV characteristics (left) and high temperature-CV characteristics (right) of a MIS diode for which the AlN layer formation temperature was 450° C. FIG. 29 shows the room temperature-CV characteristics (left) and high temperature-CV characteristics (right) of a MIS diode for which the AlN layer formation temperature was 550° C. It can be known from FIG. 25 to FIG. 29 that the frequency dispersion and the state of humps are relatively favorable up to the temperature of 450° C., but deteriorate when the temperature reaches 550° C. Suitable AlN layer formation temperatures can be said to be 250 to 450° C.

Fourth Example

After a 200 nm thick-GaAs layer was formed on a GaAs wafer, and a 100-nm depth recess structure was formed, an AlN layer whose design thickness was 1 nm and a 10 nm thick-$Al_2O_3$ layer were formed. Other conditions were similar to those in the first example. A source electrode and a drain electrode were formed, and a gate electrode was formed on the recess structure to produce a MIS transistor according to the fourth example. For comparison, a MIS transistor according to the comparative example that is similar to that according to the fourth example except for that an AlN layer was not formed was produced.

FIG. 30 shows the Id-Vd characteristics and gm-Vd characteristics of the MIS transistor according to the fourth example. FIG. 31 shows the Id-Vd characteristics and gm-Vd characteristics of the MIS transistor according to the comparative example. In FIG. 30 and FIG. 31, the solid lines correspond to the Id-Vd characteristics, and the circle plots correspond to the gm-Vd characteristics. Also, the right graphs show the Id-Vd characteristics with the range of Vd shown by being enlarged. The graphs show the cases where Vg was changed within the range of −3 to 3V (0.5-V steps). The transistor according to the fourth example shows favorable IV characteristics and conductance characteristics as compared with the comparative example. FIG. 32 shows the Id-Vg characteristics and S values of the MIS transistors according to the fourth example and the comparative example when Vd=0.05 V. In FIG. 32, the solid line corresponds to the results of the fourth example, and the broken line corresponds to the results of the comparative example. As is obvious from FIG. 32, the Id-Vg characteristics of the transistor according to the fourth example are improved significantly as compared with those of the comparative example, and the S value is as low as 100 mV/dec.

FIG. 33 and FIG. 34 are graphs showing the mobility ($\mu_{eff}$) of the MIS transistor according to the fourth example. FIG. 33 shows the mobility in relation to the sheet carrier concentration (Ns), and FIG. 34 shows the mobility in relation to the effective electric field intensity ($E_{eff}$). The gate length and gate width of the MIS transistor were 10 μm and 100 μm, respectively.

The mobility shown in FIG. 33 was calculated from the Id-Vg measurement and Cg-Vg measurement of the MIS transistor by the Split-CV method. The mobility shown in FIG. 34 was calculated, by using Equation 1, from measurement data about two devices having the gate lengths of 10 μm and 5 μm, respectively, in order to eliminate parasitic resistances and parasitic capacitances.

$$\mu_{eff} = (L_{m,1} - L_{m,2})^2 \cdot \frac{1}{\int (C_{gc,1} - C_{gc,2}) dV_g} \cdot \frac{1}{V_{DS}} \cdot \left( \frac{1}{I_{DS,1}} - \frac{1}{I_{DS,2}} \right)^{-1} \quad \text{[Equation 1]}$$

Note that in Equation 1, $L_{m,1}$, $L_{m,2}$, $C_{gc,1}$, $C_{gc,2}$, $V_g$, $V_{DS}$, $I_{DS,1}$ and $I_{DS,2}$ indicate the gate length of the device having the gate length of 10 μm, the gate length of the device having the gate length of 5 µm, the gate capacitance of the device having the gate length of 10 µm, the gate capacitance of the device having the gate length of 5 µm, the gate voltage, the voltage between the drain and the source, the drain current of the device having the gate length of 10 µm, and the drain current of the device having the gate length of 5 µm, respectively. Also, in FIG. 34, the values of the mobility shown in FIG. 33 are displayed by being superimposed.

As indicated in FIG. 33 and FIG. 34, it was confirmed that the mobility was considerably improved by using an AlN/Al$_2$O$_3$ gate as compared with an Al$_2$O$_3$ gate.

As described above, it can be known that to form the AlN layers according to the first to fourth examples between a semiconductor and an insulator of a MIS structure is extremely effective in reducing interface states.

Fifth Example

In the present fifth example, an example of producing a PHEMT (Pseudomorphic High Electron Mobility Transistor) formed by using an AlN layer and an Al$_2$O$_3$ layer for a gate insulator of a MIS gate structure is explained.

By using MOCVD, a semiconductor multi-layer structure shown in FIG. 35 was formed. As a semiconductor multi-layer structure, a buffer layer, an AlGaAs back side barrier layer, an InGaAs channel layer, an AlGaAs front side barrier layer, an n-InGaP etch stop layer and an n-GaAs contact layer were formed on an semi-insulative GaAs monocrystalline wafer. The AlGaAs back side barrier layer and the AlGaAs front side barrier layer had a three-layer configuration of i-AlGaAs/n-AlGaAs/i-AlGaAs. The Al or In composition, thickness and doping concentration of n-type impurities, Si, of each layer were as described in FIG. 35.

A MOS gate-type PHEMT was formed by using the above-mentioned semiconductor multi-layer structure wafer. FIG. 36 shows a cross-section of a formed MOS gate-type PHEMT. First, the n-GaAs contact layer and the n-InGaP etch stop layer were etched, and a recess structure was formed. Selective etching by using an ammonia peroxide aqueous solution was used for etching of the n-GaAs contact layer, and a HCl aqueous solution was used for selective etching of the n-InGaP etch stop layer.

Next, the surface was cleaned by using a diluted ammonia aqueous solution as preprocessing of insulating film formation, and a sample (semiconductor multi-layer structure wafer on which a recess structure had been formed) was introduced into a MOCVD equipment to form an AlN layer/an Al$_2$O$_3$ layer. The formation conditions of the AlN layer/the Al$_2$O$_3$ layer were the same as those in the first example.

The sample was taken out of the MOCVD reactor, and nitrogen annealing was performed under the conditions of 600° C. and 90 seconds. Part of the insulating film was removed for source/drain formation, the AuGe/Ni/Au layer was vapor-deposited, and the AuGe/Ni/Au layer was patterned by lift-off to form a source electrode and a drain electrode. Subsequently, hydrogen annealing was performed under the conditions of 400° C. and 90 seconds, and ohmic contacts were formed in the source electrode and the drain electrode.

Lastly, an Ni/Au layer was vapor-deposited/patterned by lift-off to form a gate electrode. The gate width was 100 µm, and the gate length was 5 µm. Note that a large FET having the gate width of 200 µm and the gate length of 100 µm was formed for mobility evaluation by the Split-CV method, and also a MOS gate-type PHEMT (MOSPHEMT) in which a gate insulating layer was constituted not with an AlN layer/an Al$_2$O$_3$ layer but with only an Al$_2$O$_3$ layer was formed as the comparative example.

FIG. 37 shows the Id-Vd characteristics of an AlN/Al$_2$O$_3$ gate MOSPHEMT. FIG. 37 shows an IV curve with a favorable shape, and a state where ON/OFF of Id is controlled by modulation of the gate voltage. As a representative characteristic, Id$_{max}$=600 mA/mm was obtained.

FIG. 38 and FIG. 39 show the Id-Vg characteristics of an AlN/Al$_2$O$_3$ gate MOSPHEMT. FIG. 38 shows a linear plot, and FIG. 39 shows a logarithmic plot. From FIG. 38, Gm$_{max}$=260 mS/mm was obtained, and from FIG. 39, the S value=80 mV/dec. was obtained. These values of Gm$_{max}$ and S value were equivalent to those of a Schottky-gate PHEMT formed by using a wafer having the same structure. FIG. 38 shows favorable operation in the region of Vg>0 where operation is difficult due to large gate leak in an existing Schottky-gate PHEMT. That is, with the formed AlN/Al$_2$O$_3$ gate MOSPHEMT, stable operation was possible even when Vg=3 V. This is considered to attribute to the gate withstanding voltage improved by using the MOS gate.

FIG. 40 shows the gate leakage current Ig measured at the same time when the Id-Vd characteristics of FIG. 38 were measured. Vg was changed within the range of +3 to −2.5 V. The value of Vd was changed within the range of 0 to 3 V. Ig never exceeded 1×10$^{-6}$ mA/mm with these measurement ranges. That is, a favorable insulation property of the AlN/Al$_2$O$_3$ gate was confirmed.

FIG. 41 shows a plot of the mobility-sheet carrier concentration (Ns) calculated by the Split-CV method from the Id-Vg characteristics and Cg-Vg characteristics of a FET having the gate length of 100 µm. For comparison, it also shows a plot of the mobility-sheet carrier concentration of the comparative example that is formed by using not an AlN/Al$_2$O$_3$ gate but a gate of only Al$_2$O$_3$. As is obvious from FIG. 41, the peak mobility increased from 4000 cm$^2$/Vs to 5725 cm$^2$/Vs by forming an AlN layer before formation of an Al$_2$O$_3$ layer. This improvement in mobility reflects lowering of the interface state density obtained in the first example. That is, it can be considered that influence of Coulomb scattering decreased because the interface state density is lowered.

Sixth Example

In the present sixth example, an example in which an Al$_2$O$_3$ layer was made thin is explained. A MOS capacitor and a MOS gate-type PHEMT were formed in a similar manner to that in the first example except for that the thickness of the Al$_2$O$_3$ layer was 4 nm.

FIG. 42 shows the CV characteristics of the MOS capacitor. Similarly favorable CV characteristics were obtained similar to a case where the Al$_2$O$_3$ layer was thick (first example). FIG. 43 shows the Id-Vd characteristics of the transistor. Favorable Id-Vd characteristics were obtained, and Id$_{max}$ reached 630 mA/mm. FIG. 44 shows the Id-Vg characteristics (logarithmic plot) of the transistor. Values of the S value are plotted in FIG. 44 as well. The S value was 83 mV/dec. FIG. 45 shows the Id-Vg characteristics (linear plot) of the transistor. Values of Gm are shown in FIG. 45 as well. Gm$_{max}$ reached 260 mS/mm. FIG. 46 shows the Id-Vg characteristics of the transistor when Vd=0.05 V. In Id-Vg measurement, sweeping was performed in which Vg was changed from negative values to positive values, and thereafter returned from positive values to negative values. It can be known from FIG. 46, that there is no hysteresis. FIG. 47 shows the mobility-sheet carrier density plot of the transistor. The mobility was calculated by the Split-CV method from the C-Vg characteristics and Id-Vg characteristics of a large FET having the gate width of 200 μm and the gate length of 100 μm that was formed for mobility evaluation. The peak mobility reached 6722 cm$^2$/Vs when the sheet carrier density was $3.1 \times 10^{12}$ cm$^{-2}$. FIG. 48 shows the C-Vg characteristics of the transistor, and FIG. 49 shows the Id-Vg characteristics of the transistor. In the Id-Vg measurement and C-Vg measurement, sweeping was performed in which Vg was changed from negative values to positive values, and thereafter returned from positive values to negative values. It can be known from FIG. 49 that there is almost no hysteresis.

As shown above, the CV characteristics that show favorable MOS interface characteristics were obtained even when an Al$_2$O$_3$ layer was made thin. Also, it can be known that favorable transistor characteristics were obtained as in the first example even when an Al$_2$O$_3$ layer was made thin.

Seventh Example

In the present seventh example, an example in which a 1 nm-thick GaN layer was used instead of the AlN layer according to the first example is explained. A semiconductor wafer was formed in a similar manner to that in the first example except for that the AlN layer in the first example was replaced with the GaN layer. Note that the GaN layer growth temperature was 425° C.

FIG. 50 and FIG. 51 show the room temperature-CV characteristics of a MIS diode formed by using the semiconductor wafer according to the seventh example. FIG. 50 shows the room temperature-CV characteristics of a p-type wafer, and FIG. 51 shows the room temperature-CV characteristics of an n-type wafer. It can be known that as in the first example, the frequency dispersion of the accumulation capacitance was improved as compared with the comparative example (FIG. 11).

FIG. 52 and FIG. 53 show the CV characteristics (high temperature-CV characteristics) at high temperature (150° C.) of a MIS diode formed by using the semiconductor wafer according to the seventh example. FIG. 52 shows the high temperature-CV characteristics of a p-type wafer, and FIG. 53 shows the high temperature-CV characteristics of an n-type wafer. It can be known that as in the first example, the humps of the inversion region are considerably small as compared with the comparative example (FIG. 13). As in the first example, because the humps in the high temperature-CV characteristics is considered as reflecting a high interface state density in the mid-gap, it can be seen that the interface state density of the mid-gap is lowered considerably as compared with the comparative example.

As shown above, as in the first example, improvement in the frequency dispersion of the accumulation capacitance, and lowering of the mid-gap interface state density were confirmed also when the GaN layer was used instead of the AlN layer.

What is claimed is:

1. A semiconductor wafer having a wafer, a compound semiconductor layer, a first insulating layer and a second insulating layer that are positioned in the order of the wafer, the compound semiconductor layer, the first insulating layer and the second insulating layer, wherein the first insulating layer contains: one or more first atoms that are selected from the group consisting of all the metallic atoms, B atoms, Si atoms, As atoms, Te atoms and At atoms; oxygen atoms; and nitrogen atoms, the second insulating layer contains: one or more second atoms selected from the group consisting of all the metallic atoms; oxygen atoms; and nitrogen atoms, the compound semiconductor layer contains: third atoms that are metallic atoms; and fourth atoms that are non-metallic atoms, in the depth direction that is from a surface of the second insulating layer to the wafer, the oxygen atoms and the nitrogen atoms are continuously distributed in the second insulating layer, the first insulating layer and the compound semiconductor layer, the number of atoms per unit volume of the nitrogen atoms along the depth direction shows its maximum in the first insulating layer, the total number of atoms per unit volume of the third atoms and the fourth atoms along the depth direction becomes the largest in the compound semiconductor layer, the number of atoms per unit volume of the oxygen atoms at a first interface which is the interface between the compound semiconductor layer and the first insulating layer is smaller than the number of atoms per unit volume of the oxygen atoms at a second interface which is the interface between the first insulating layer and the second insulating layer.

2. The semiconductor wafer according to claim 1, wherein the first atoms and the second atoms are insulating layer-constituting metallic atoms consisting of a homogeneous element, and in the depth direction, the insulating layer-constituting metallic atoms, the oxygen atoms and the nitrogen atoms are distributed continuously in the second insulating layer, the first insulating layer and the compound semiconductor layer.

3. The semiconductor wafer according to claim 2, wherein the number of atoms per unit volume of the insulating layer-constituting metallic atoms at the first interface is smaller than the number of atoms per unit volume of the insulating layer-constituting metallic atoms at the second interface.

4. The semiconductor wafer according to claim 1, wherein the number of atoms per unit volume of the third atoms at the first interface is larger than the number of atoms per unit volume of the third atoms at the second interface, and the number of atoms per unit volume of the fourth atoms at the first interface is larger than the number of atoms per unit volume of the fourth atoms at the second interface.

5. The semiconductor wafer according to claim 1, wherein the number of atoms per unit volume of the nitrogen atoms in the second insulating layer along the depth direction increases as the depth increases.

6. The semiconductor wafer according to claim 1, wherein the number of atoms per unit volume of the nitrogen atoms in the compound semiconductor layer along the depth direction decreases as the depth increases.

7. The semiconductor wafer according to claim 1, wherein the third atoms and the fourth atoms are present in the first insulating layer, and the number of atoms per unit volume of the third atoms and the fourth atoms in the first insulating layer along the depth direction increases as the depth increases.

8. The semiconductor wafer according to claim 1, wherein the first atoms are one or more atoms selected from the group consisting of Al atoms, Ga atoms, In atoms, Ti atoms, Zr atoms, Hf atoms, Gd atoms, Er atoms, B atoms, Si atoms, As atoms, Te atoms and At atoms, and the second atoms are one or more atoms selected from the group consisting of Al atoms, Ga atoms, In atoms, Ti atoms, Zr atoms, Hf atoms, Gd atoms and Er atoms.

9. The semiconductor wafer according to claim 1, wherein the first insulating layer and the second insulating layer contain hydrogen atoms, and the largest value of the number of atoms per unit volume of hydrogen atoms in the first insulating layer is larger than the largest value of the number of atoms per unit volume of hydrogen atoms in the second insulating layer.

10. The semiconductor wafer according to claim 1, wherein the first insulating layer is formed by CVD at a wafer temperature of 250° C. or higher and 450° C. or lower, and the second insulating layer is formed by ALD successively without exposure to the atmosphere after forming the first insulating layer.

11. An electronic device comprising the semiconductor wafer according to claim 1, a source electrode, a drain electrode, and a gate electrode, wherein the compound semiconductor layer, the first insulating layer, the second insulating layer and the gate electrode are positioned in the order of the compound semiconductor layer, the first insulating layer, the second insulating layer and the gate electrode, and the source electrode and the drain electrode are positioned to sandwich the gate electrode in a planar arrangement, and are electrically connected with the compound semiconductor layer.

12. The electronic device according to claim 11, wherein the compound semiconductor layer has a recess structure, and the gate electrode is positioned on the recess structure.

13. A method of producing a semiconductor wafer, the method comprising:

forming a compound semiconductor layer on a wafer;

forming a first insulating layer on the compound semiconductor layer by CVD by using a first gas and a second gas as source gases, and at a wafer temperature of 250° C. or higher and 450° C. or lower; and after forming the first insulating layer, forming a second insulating layer by ALD by using a third gas and a fourth gas, wherein the first gas is a gas containing a gaseous compound of first atoms, the second gas is one or more gases selected from the group consisting of gaseous nitrogen compounds and nitrogen molecules, the third gas is a gas containing a gaseous compound of second atoms, the fourth gas is one or more gases selected from the group consisting of gaseous oxygen compounds and oxygen molecules, the first atoms are one or more atoms selected from the group consisting of all the metallic atoms, B atoms, Si atoms, As atoms, Te atoms and At atoms, and the second atoms are one or more atoms selected from the group consisting of all the metallic atoms, in the depth direction that is from a surface of the second insulating layer to the wafer, the oxygen atoms and the nitrogen atoms are continuously distributed in the second insulating layer, the first insulating layer and the compound semiconductor layer, the number of atoms per unit volume of the nitrogen atoms along the depth direction shows its maximum in the first insulating layer, the total number of atoms per unit volume of the third atoms and fourth atoms along the depth direction becomes the largest in the compound semiconductor layer, and the number of atoms per unit volume of the oxygen atoms at a first interface which is the interface between the compound semiconductor layer and the first insulating layer is smaller than the number of atoms per unit volume of the oxygen atoms at a second interface which is the interface between the first insulating layer and the second insulating layer.

14. The method according to claim 13 of producing a semiconductor wafer, wherein after forming the first insulating layer, the second insulating layer is formed successively without exposure to the atmosphere.

* * * * *